(12) United States Patent
Yamashita

(10) Patent No.: US 8,426,103 B2
(45) Date of Patent: *Apr. 23, 2013

(54) POSITIVE RESIST COMPOSITION FOR USE WITH ELECTRON BEAM, X-RAY OR EUV AND PATTERN FORMING METHOD USING THE SAME

(75) Inventor: Katsuhiro Yamashita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 782 days.

This patent is subject to a terminal disclaimer.

(21) Appl. No.: 12/370,368

(22) Filed: Feb. 12, 2009

(65) Prior Publication Data

US 2009/0202946 A1    Aug. 13, 2009

Related U.S. Application Data

(60) Provisional application No. 61/029,007, filed on Feb. 15, 2008.

(30) Foreign Application Priority Data

Feb. 13, 2008 (JP) .................. 2008-032154

(51) Int. Cl.
*G03F 7/039* (2006.01)
*G03F 7/20* (2006.01)
*G03F 7/30* (2006.01)

(52) U.S. Cl.
USPC ........ 430/270.1; 430/311; 430/326; 430/905; 430/907; 430/922; 430/942; 430/966

(58) Field of Classification Search ............... None
See application file for complete search history.

(56) References Cited

U.S. PATENT DOCUMENTS

| | | | |
|---|---|---|---|
| 5,561,194 A | 10/1996 | Cornett et al. | |
| 6,492,086 B1 | 12/2002 | Barclay et al. | |
| 7,202,010 B2 | 4/2007 | Yamada et al. | |
| 7,326,513 B2 | 2/2008 | Yasunami et al. | |
| 2003/0099900 A1 | 5/2003 | Yamada et al. | |
| 2003/0207200 A1 | 11/2003 | Barclay et al. | |
| 2004/0018445 A1 | 1/2004 | Akita et al. | |
| 2004/0175654 A1 | 9/2004 | Yasunami et al. | |
| 2005/0233245 A1* | 10/2005 | Koitabashi et al. | 430/270.1 |
| 2006/0194147 A1* | 8/2006 | Kawanishi | 430/270.1 |
| 2007/0184384 A1 | 8/2007 | Kawanishi | |
| 2007/0248908 A1 | 10/2007 | Huang | |
| 2008/0187860 A1* | 8/2008 | Tsubaki et al. | 430/270.1 |
| 2008/0311515 A1* | 12/2008 | Mimura et al. | 430/285.1 |
| 2009/0075177 A1* | 3/2009 | Ando et al. | 430/5 |

FOREIGN PATENT DOCUMENTS

| | | |
|---|---|---|
| EP | 1939691 A2 | 7/2008 |
| EP | 2020616 A2 | 2/2009 |
| JP | 2001-166474 A | 6/2001 |
| JP | 2001-166478 A | 6/2001 |
| JP | 2001-194792 A | 7/2001 |
| JP | 2003-107708 A | 4/2003 |
| JP | 2004-109959 A | 4/2004 |
| JP | 2004-271629 A | 9/2004 |
| JP | 2005-234434 A | 9/2005 |
| JP | 2007-94356 A | 4/2007 |
| JP | 2007-210904 A | 8/2007 |
| WO | WO 2006/059569 A1 * | 6/2006 |
| WO | 2008-007578 A1 | 1/2008 |

OTHER PUBLICATIONS

Extended European Search Report dated Jun. 25, 2009.
Office Action dated Feb. 28, 2012 on Japanese Application No. 2008-032154.

* cited by examiner

*Primary Examiner* — Sin J. Lee
(74) *Attorney, Agent, or Firm* — Sughrue Mion, PLLC

(57) ABSTRACT

A positive resist composition for use with electron beam, X-ray or EUV and a pattern forming method using the positive resist composition are provided, the positive resist composition including: (A) a resin capable of decomposing under an action of an acid to increase a dissolution rate in an aqueous alkali solution; (B) a compound capable of generating an acid upon irradiation with actinic rays or radiation; (C) a basic compound; and (D) an organic solvent, wherein the entire solid content concentration in the resist composition is from 1.0 to 4.5 mass % and a ratio of (B) the compound capable of generating an acid upon irradiation with actinic rays or radiation is from 10 to 50 mass % based on the entire solid content.

9 Claims, No Drawings

POSITIVE RESIST COMPOSITION FOR USE WITH ELECTRON BEAM, X-RAY OR EUV AND PATTERN FORMING METHOD USING THE SAME

BACKGROUND OF THE INVENTION

1. Field of the Invention

The present invention relates to a positive resist composition suitable for use in the ultramicrolithography process such as production of VLSI or a high-capacity microchip or in other photofabrication processes. More specifically, the present invention relates to a positive resist composition capable of forming a high-resolution pattern by using electron beam, EUV or the like, that is, a positive resist composition suitably usable for fine processing of a semiconductor device, where electron beam or EUV light is used, and a pattern forming method using the same.

2. Description of the Related Art

In the process of producing a semiconductor device such as IC and LSI, fine processing by lithography using a photoresist composition has been conventionally performed. With the recent trend toward high integration of an integrated circuit, it is becoming necessary to form an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV light is proceeding.

The lithography using electron beam or EUV light is positioned as a next-generation or next-next-generation pattern formation technique and a high-sensitivity positive resist is being demanded.

In particular, the elevation of sensitivity is very important for shortening the wafer processing time. A chemical amplification-type positive resist generally comprises a resin insolubilized to alkali by protecting the alkali-soluble group with an acid-decomposable group, a photoacid generator and a basic compound. The photoacid generator is decomposed upon exposure to generate an acid, and this acid decomposes the acid-decomposable group while diffusing in the resist film, whereby the resin is insolubilized to alkali. Accordingly, in order to elevate the sensitivity, it is preferred to encourage the acid to diffuse and cause a deprotection reaction.

On the other hand, a process margin such as exposure latitude (EL) is also an important factor in view of performance. EL is known to deteriorate when an acid diffuses.

The amount of deprotection per the number of acids generated is preferably increased for achieving high sensitivity, but this at the same time involves diffusion of an acid and therefore, it is a difficult technical problem to realize both high sensitivity and high EL.

For realizing high sensitivity while suppressing the diffusion of acid, it is considered to be effective to elevate the acid generation efficiency. This may be attained if the decomposition efficiency or concentration of the photoacid generator can be raised, but when the concentration of the photoacid generator is raised, there may arise a problem that the photoacid generator aggregates, deteriorates in the aging stability or precipitates.

U.S. Pat. No. 5,561,194, JP-A-2001-166474 (the term "JP-A" as used herein means an "unexamined published Japanese patent application"), JP-A-2001-166478, JP-A-2003-107708, JP-A-2001-194792 and JP-A-2005-234434) each discloses a photoresist composition using a phenolic acid-decomposable resin obtained by copolymerizing an acid-decomposable acrylate monomer having an alicyclic group as an acid-decomposable group.

U.S. Patent Application Publication No. 2007/0248908 discloses a resist containing a resin, an acid generator, a basic compound and a solvent each in a predetermined amount, where the resin is a copolymer of a hydrophilic monomer with the polar group being partially protected by an unstable group with a low activation energy and a hydrophobic monomer having an aromatic cyclic group.

JP-A-2007-210904 discloses a photosensitive composition containing a specific sulfonium salt as an acid generator with an attempt to improve the sensitivity, resolution and pattern profile and solve the problems of roughness and out-gas.

JP-A-2004-271629 discloses a positive resist composition containing a specific resin and a sulfonic acid generator, where the concentration of the sulfonic acid generator is specified.

SUMMARY OF THE INVENTION

An object of the present invention is to solve the problems in the technology for enhancing the performance when performing the fine processing of a semiconductor device by using actinic rays or radiation, particularly electron beam, X-ray or EUV light and provide a positive resist composition assured of high sensitivity, insusceptibility to fluctuation of the exposure amount, that is, high EL, and good aging stability and a pattern forming method using the composition.

The above-described object can be attained by the following constructions.

(1) A positive resist composition for use with electron beam, X-ray or EUV, comprising:

(A) a resin capable of decomposing under an action of an acid to increase a dissolution rate in an aqueous alkali solution;

(B) a compound capable of generating an acid upon irradiation with actinic rays or radiation;

(C) a basic compound; and (D) an organic solvent, wherein the entire solid content concentration in the resist composition is from 1.0 to 4.5 mass % and a ratio of (B) the compound capable of generating an acid upon irradiation with actinic rays or radiation is from 10 to 50 mass % based on the entire solid content.

(2) The positive resist composition as described in (1) above, wherein a molecular weight of (C) the basic compound is from 250 to 1,000 and a ratio of (C) the basic compound is from 1.0 to 8.0 mass % based on the entire solid content of the resist composition.

(3) The positive resist composition as described in (1) or (2) above, wherein (B) the compound capable of generating an acid upon irradiation with actinic rays or radiation is a compound represented by formula (I):

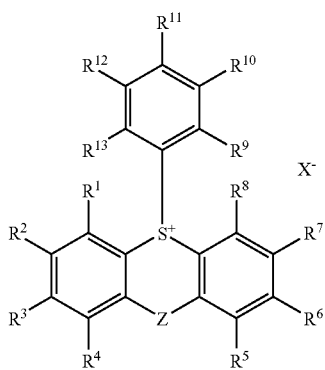

wherein $R^1$ to $R^{13}$ each independently represents a hydrogen atom or a substituent;

Z represents a single bond or a divalent linking group; and $X^-$ represents a counter anion.

(4) The positive resist composition as described in any one of (1) to (3) above, wherein (A) the resin capable of decomposing under an action of an acid to increase the dissolution rate in an aqueous alkali solution has a repeating unit represented by formula (II) and a repeating unit represented by formula (III):

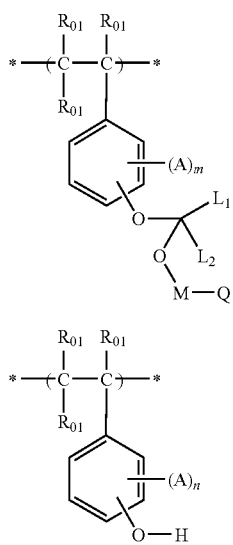

wherein each $R_{01}$ independently represents a hydrogen atom, an alkyl group, a cycloalkyl group, a halogen atom, a cyano group or an alkoxycarbonyl group;

$L_1$ and $L_2$, which may be the same or different, each represents a hydrogen atom, an alkyl group, a cycloalkyl group, an aryl group or an aralkyl group;

M represents a single bond or a divalent linking group;

Q represents an alkyl group, a cycloalkyl group, an aryloxy group or an alicyclic or aromatic cyclic group which may contain a hetero atom;

at least two members out of Q, M and $L_1$ may combine to form a 5- or 6-membered ring;

A represents a halogen atom, a cyano group, an acyl group, an alkyl group, an alkoxy group, an acyloxy group or an alkoxycarbonyl group, and when a plurality of A's are present, the plurality of A's may be the same or different; and m and n each independently represents an integer of 0 to 4.

(5) The positive resist composition as described in any one of (1) to (4) above, wherein 50 mass % or more of (D) the organic solvent is a propylene glycol monomethyl ether.

(6) The positive resist composition as described in any one of (3) to (5) above, wherein at least one of $R^1$ to $R^{13}$ is a substituent containing an alcoholic hydroxyl group.

(7) The positive resist composition as described in any one of (4) to (6) above, wherein m and n are not 0 at the same time.

(8) The positive resist composition as described in any one of (4) to (7) above, wherein (A) the resin further has a repeating unit represented by formula (IV):

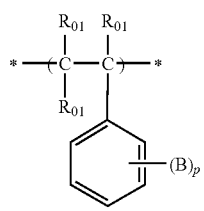

wherein each $R_{01}$ independently represents a hydrogen atom, an alkyl group, a cycloalkyl group, a halogen atom, a cyano group or an alkoxycarbonyl group;

B represents a halogen atom, a cyano group, an acyl group, an alkyl group, an alkoxy group, an acyloxy group or an alkoxycarbonyl group, and when a plurality of B's are present, the plurality of B's may be the same or different; and p represents an integer of 0 to 5.

(9) A pattern forming method, comprising:

forming a resist film by using the positive resist composition as described in any one of (1) to (8) above; and subjecting the resist film to exposure with electron beam, X-ray or EUV and development.

DETAILED DESCRIPTION OF THE INVENTION

The present invention is described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Resin Capable of Decomposing Under the Action of an Acid to Increase the Solubility in an Alkali Developer The resin capable of decomposing under the action of an acid to increase the solubility in an alkali developer (hereinafter sometimes referred to as an "acid-decomposable resin"), which is used in the positive resist composition of the present invention, is a resin having a group (acid-decomposable group) capable of decomposing under the action of an acid to produce an alkali-soluble group, in ether one or both of the main chain and the side chain of the resin. Of these, a resin having an acid-decomposable group in the side chain is preferred.

The group preferred as the acid-decomposable group is a group obtained by substituting the hydrogen atom of an alkali-soluble group such as —COOH group and —OH group by a group capable of leaving under the action of an acid.

In the present invention, the acid-decomposable group is preferably an acetal group or a tertiary ester group.

In the case where such a group capable of decomposing under the action of an acid is bonded as a side chain, the matrix resin is an alkali-soluble resin having a —OH or —COOH group in the side chain.

The alkali dissolution rate of such an alkali-soluble resin is preferably 80 Å/sec or more, more preferably 160 Å/sec or more, as measured (at 23° C.) in 0.261N tetramethylammonium hydroxide (TMAH).

The acid-decomposable resin preferably contains a repeating unit having an aromatic group, and the resin is more preferably an acid-decomposable resin having a hydroxystyrene repeating unit (hereinafter sometimes referred to as a "resin (A1)"), still more preferably a copolymer of hydroxystyrene/hydroxystyrene protected with an acid-decomposable group, or hydroxystyrene/tertiary alkyl (meth)acrylate.

Specific examples of the resin (A1) are set forth below, but the present invention is not limited thereto.

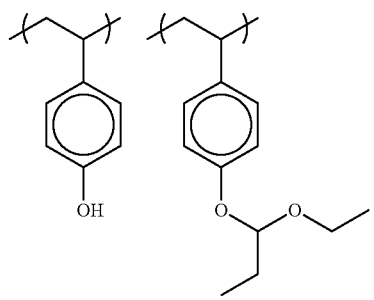

(R-1)

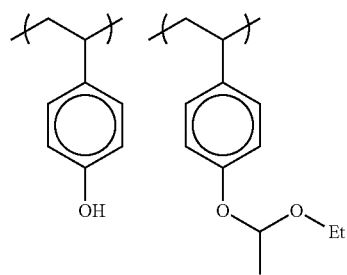

(R-2)

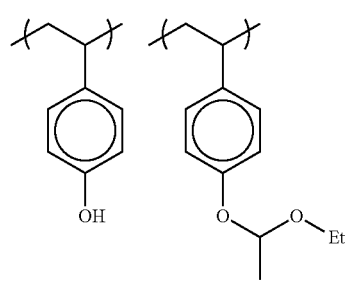

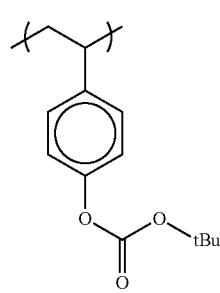

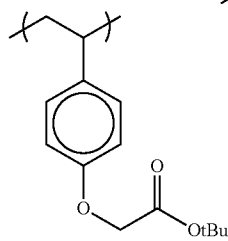

(R-3)

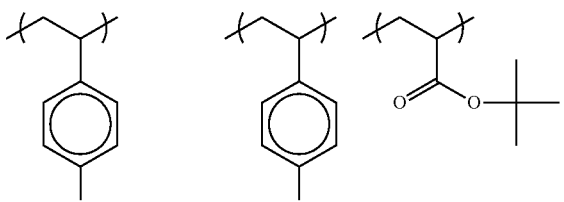

(R-4)

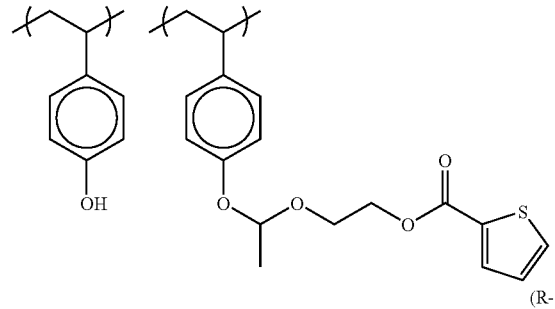

(R-5)

(R-6)

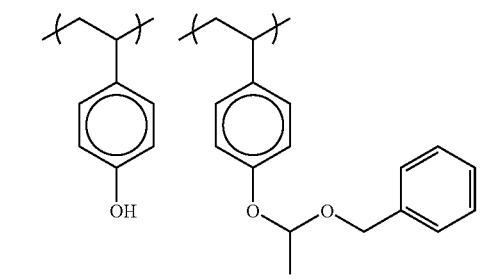

(R-7)

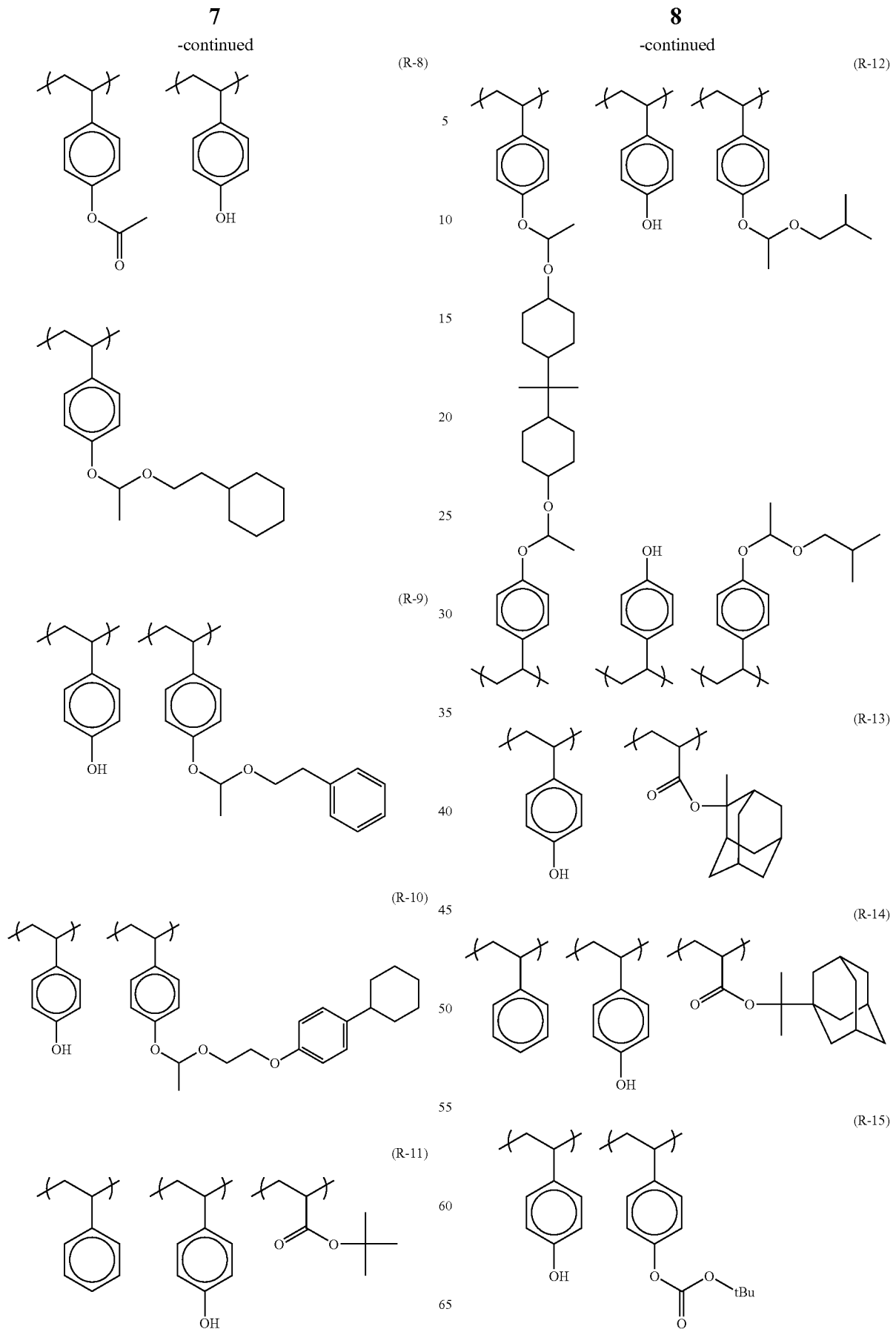

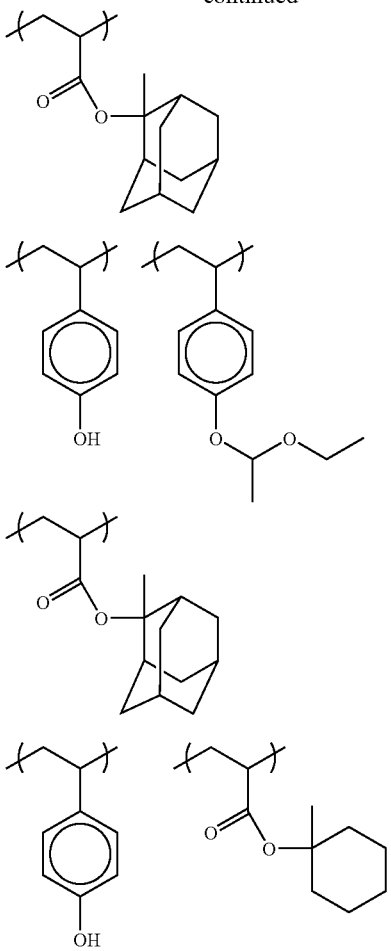

(R-16)

(R-17)

In specific examples above, tBu indicates a tert-butyl group.

The content ratio of repeating units having the groups capable of decomposing under the action of an acid is expressed by B/(B+S) using the content (B) of repeating units having groups capable of decomposing under the action of an acid and the content (S) of repeating units having alkali-soluble groups not protected by a group capable of leaving under the action of an acid, in the resin. The content ratio is preferably from 0.01 to 0.7, more preferably from 0.05 to 0.50, still more preferably from 0.05 to 0.40.

The resin (A1) is preferably a rein having a repeating unit represented by the following formula (II) and a repeating unit represented by formula (III).

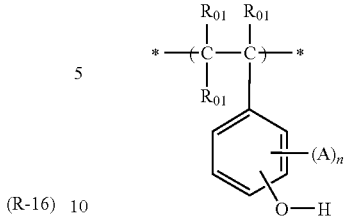

(II)

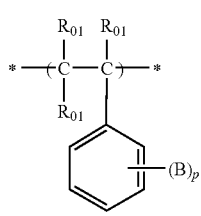

(III)

In formulae (II) and (III), each $R_{01}$ independently represents a hydrogen atom, an alkyl group, a cycloalkyl group, a halogen atom, a cyano group or an alkoxycarbonyl group.

$L_1$ and $L_2$, which may be the same or different, each represents a hydrogen atom, an alkyl group, a cycloalkyl group, an aryl group or an aralkyl group.

M represents a single bond or a divalent linking group.

Q represents an alkyl group, a cycloalkyl group, an aryloxy group, or an alicyclic or aromatic cyclic group which may contain a heteroatom.

At least two members out of Q, M and $L_1$ may combine to form a 5- or 6-membered ring.

A represents, or when a plurality of A's are present, each independently represents, a halogen atom, a cyano group, an acyl group, an alkyl group, an alkoxy group, an acyloxy group or an alkoxycarbonyl group.

m and n each independently represents an integer of 0 to 4, provided that m and n are preferably not 0 at the same time.

The resin (A1) may be a resin having a repeating unit represented by formula (II), a repeating unit represented by formula (III) and a repeating unit represented by formula (IV). In this case, m and n may be m=n=0.

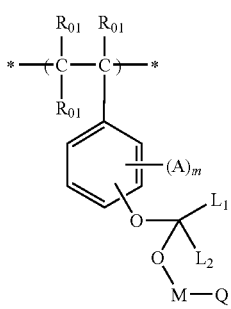

(IV)

In formula (IV), each $R_{01}$ independently represents a hydrogen atom, an alkyl group, a cycloalkyl group, a halogen atom, a cyano group or an alkoxycarbonyl group.

B represents a halogen atom, a cyano group, an acyl group, an alkyl group, an alkoxy group, an acyloxy group or an alkoxycarbonyl group. When a plurality of B's are present, the plurality of B's may be the same or different.

p represents an integer of 0 to 5.

The substituent on the benzene ring in the repeating unit represented by formula (II) is a group (acid-decomposable group) capable of decomposing under the action of an acid to produce a hydroxyl group (alkali-soluble group) and decomposes under the action of an acid to produce a hydroxystyrene unit and convert the resin into a resin of which solubility in an alkali developer is increased.

In formulae (II) to (IV), each $R_{01}$ independently represents a hydrogen atom, an alkyl group, a cycloalkyl group, a halogen atom, a cyano group or an alkoxycarbonyl group and preferably has a carbon number of 20 or less.

The alkyl group and cycloalkyl group in $R_{01}$ preferably have a carbon number of 20 or less, and examples thereof include a methyl group, an ethyl group, a propyl group, an isopropyl group, an n-butyl group, an isobutyl group, a tert-butyl group, a pentyl group, a cyclopentyl group, a hexyl group, a cyclohexyl group, an octyl group and a dodecyl group. These groups each may have a substituent, and examples of the substituent include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. The substituent preferably has a carbon number of 8 or less. A $CF_3$ group, an alkoxycarbonylmethyl group, an alkylcarbonyloxymethyl group, a hydroxymethyl group, an alkoxymethyl group and the like are more preferred.

The halogen atom in $R_{01}$ includes a fluorine atom, a chlorine atom, a bromine atom and an iodine atom and is preferably a fluorine atom.

As for the alkyl group contained in the alkoxycarbonyl group of $R_{01}$, the same as those described above for the alkyl group of $R_{01}$ are preferred.

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group and an adamantyl group.

The aryl group as $L_1$ and $L_2$ is, for example, an aryl group having a carbon number of 6 to 15, and specific preferred example thereof include a phenyl group, a tolyl group, a naphthyl group and an anthryl group.

The aralkyl group as $L_1$ and $L_2$ is, for example, an aralkyl group having a carbon number of 6 to 20, and examples thereof include a benzyl group and a phenethyl group.

It is preferred that either one of $L_1$ and $L_2$ is a hydrogen atom.

The divalent linking group as M is, for example, an alkylene group, a cycloalkylene group, an alkenylene group, an arylene group, —OCO—, —COO—, —CON($R_0$)— or a linking group containing a plurality of these members. $R_0$ is a hydrogen atom or an alkyl group.

The alkyl group and cycloalkyl group as Q are the same as the alkyl group and cycloalkyl group, respectively, of $L_1$ and $L_2$.

The aryloxy group as Q includes, for example, a phenoxy group, a naphthoxy group and a terphenyloxy group.

The alicyclic or aromatic cyclic group as Q, which may contain a heteroatom, includes, for example, the cycloalkyl group and aryl group of $L_1$ and $L_2$ and preferably has a carbon number of 3 to 15.

Examples of the heteroatom-containing alicyclic or aromatic cyclic group include thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the cyclic group is not limited thereto as long as it has a structure generally called a hetero ring (a ring formed by carbon and heteroatom or a ring formed by heteroatom).

As for the 5- or 6-membered ring which may be formed by combining at least two members out of Q, M and $L_1$, there is included a case where at least two members out of Q, M and $L_1$ combine to form, for example, a propylene group or a butylene group, thereby forming a 5- or 6-membered ring containing an oxygen atom.

The group represented by -M-Q preferably has a carbon number of 1 to 30, more preferably from 5 to 20, and, for example, the group represented by —OC($L_1$)($L_2$)O-M-Q includes the followings.

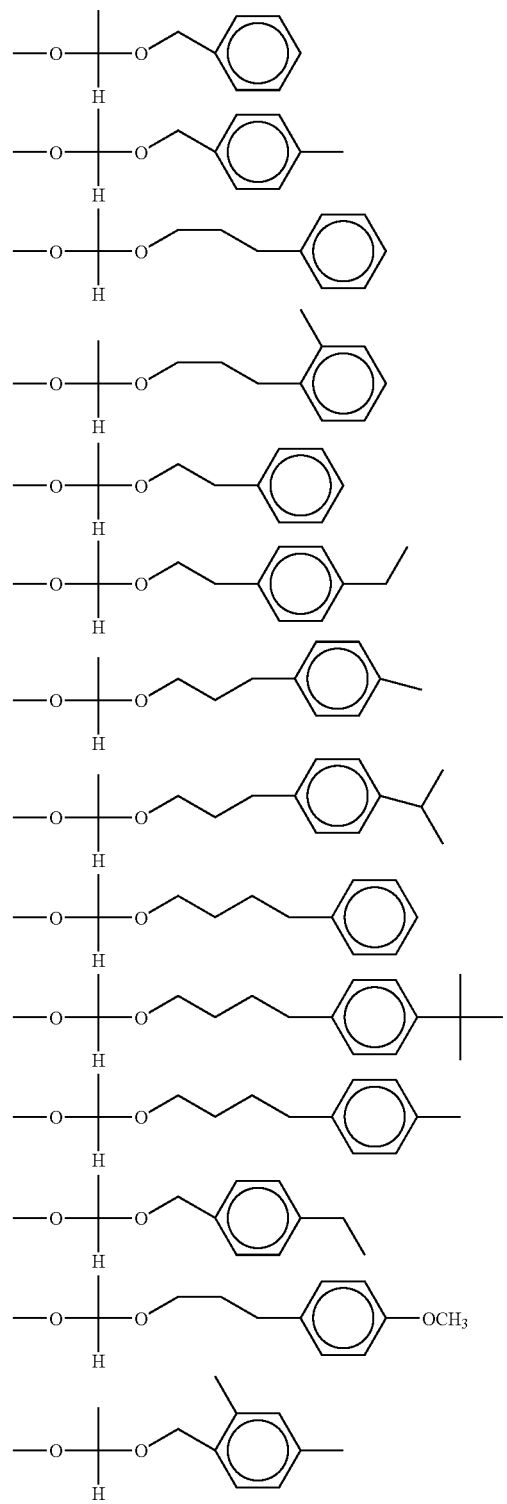

-continued

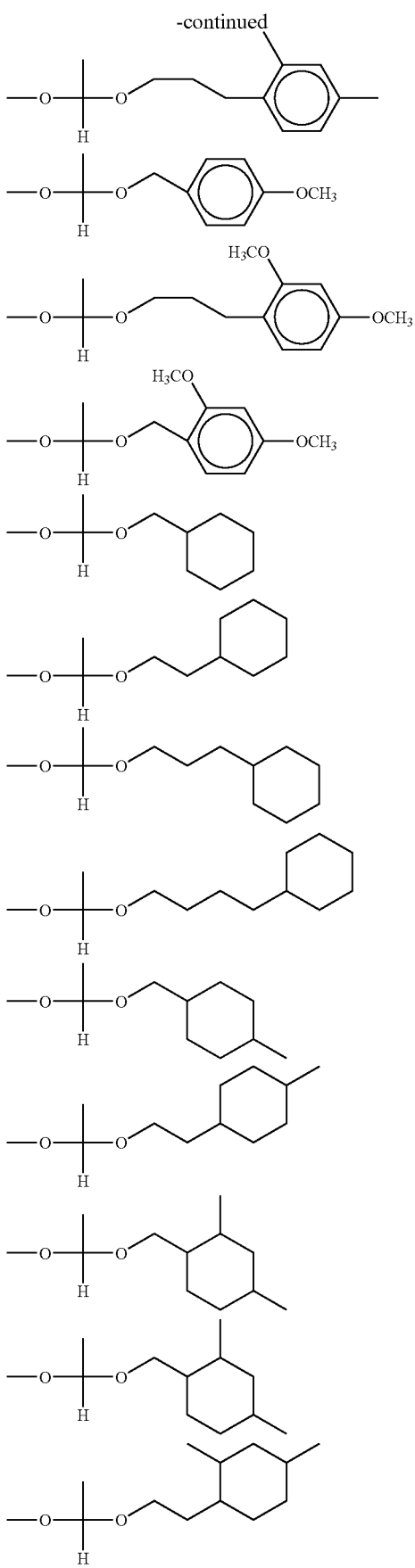

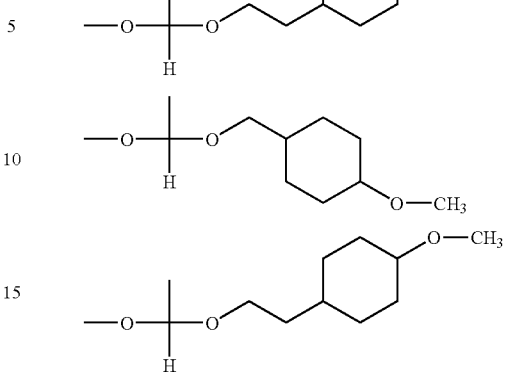

The acyl group as A is, for example, an acyl group having a carbon number of 2 to 8, and specific preferred examples thereof include a formyl group, an acetyl group, a propanoyl group, a butanoyl group, a pivaloyl group and a benzoyl group.

The alkyl group as A is, for example, an alkyl group having a carbon number of 1 to 8, and specific preferred examples thereof include a methyl group, an ethyl group, a propyl group, an n-butyl group, a sec-butyl group, a hexyl group and an octyl group.

The alkoxy group as A is, for example, the above-described alkoxy group having a carbon number of 1 to 8, and examples thereof include a methoxy group, an ethoxy group, a propoxy group, a butoxy group, a pentyloxy group, a hexyloxy group and a cyclohexyloxy group.

The acyloxy group or alkoxycarbonyl group as A includes groups corresponding to the above-described acyl group or alkoxy group.

These groups explained in formulae (II) to (IV) each may have a substituent, and preferred examples of the substituent include a hydroxyl group, a carboxyl group, a cyano group, a halogen atom (fluorine, chlorine, bromine, iodine) and an alkoxy group (e.g., methoxy, ethoxy, propoxy, butoxy). As for the cyclic structure, examples of the substituent further include an alkyl group (preferably having a carbon number of 1 to 8).

m and n each independently represents an integer of 0 to 4 and each is preferably an integer of 0 to 2, more preferably 1.

Specific examples of the repeating unit represented by formula (II) are set forth below, but the present invention is not limited thereto.

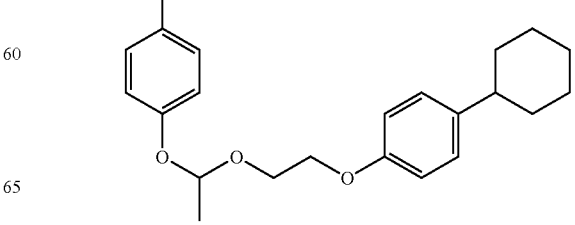

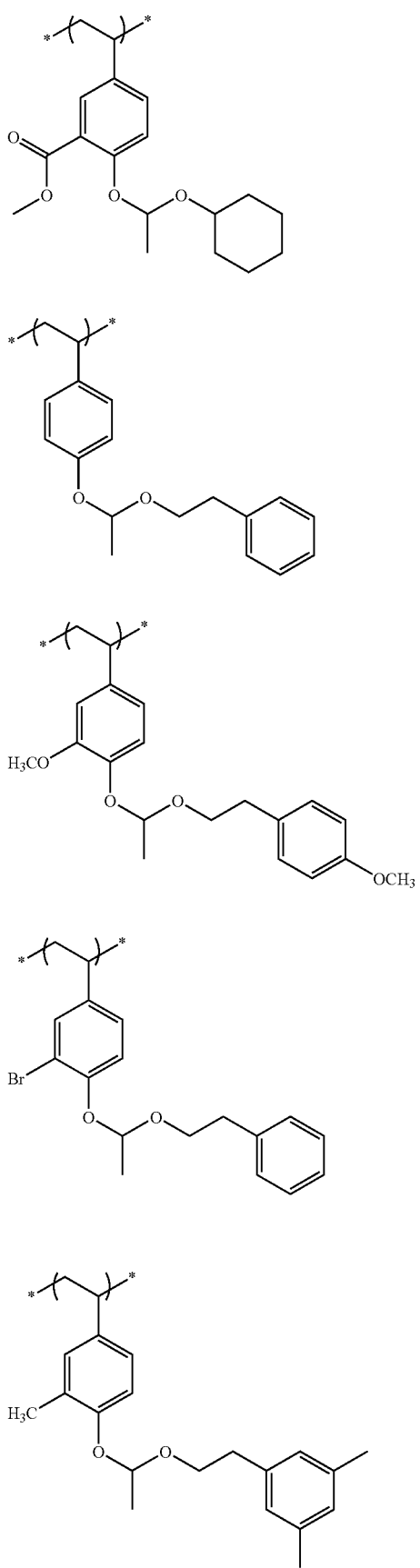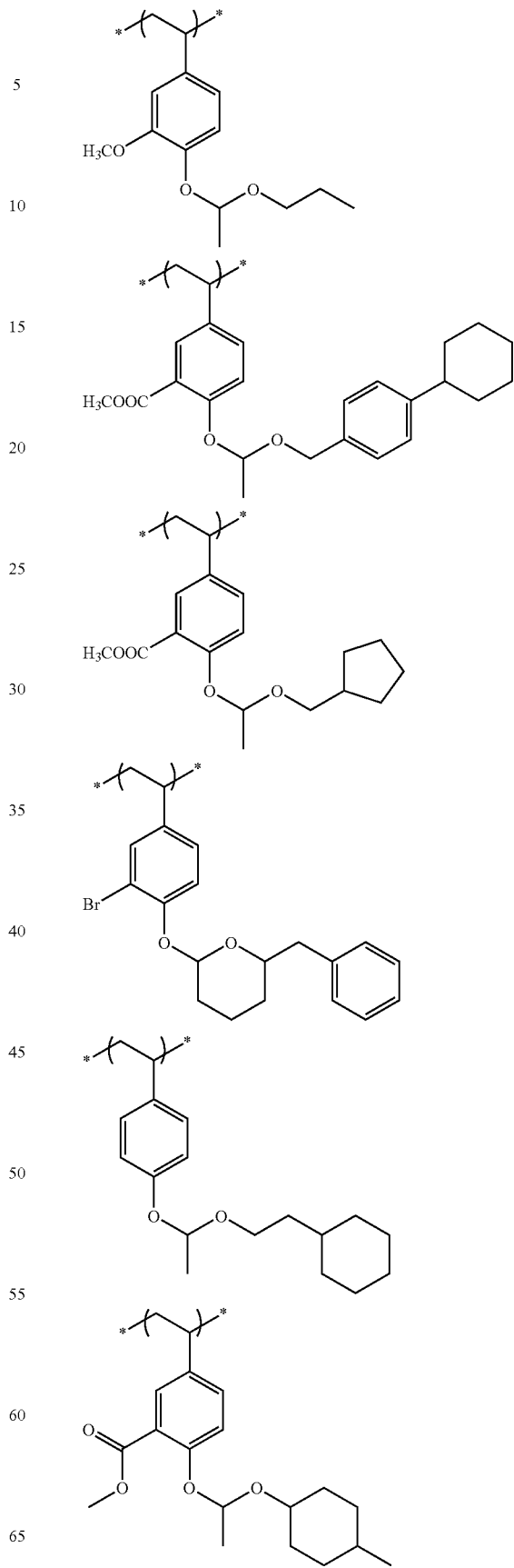

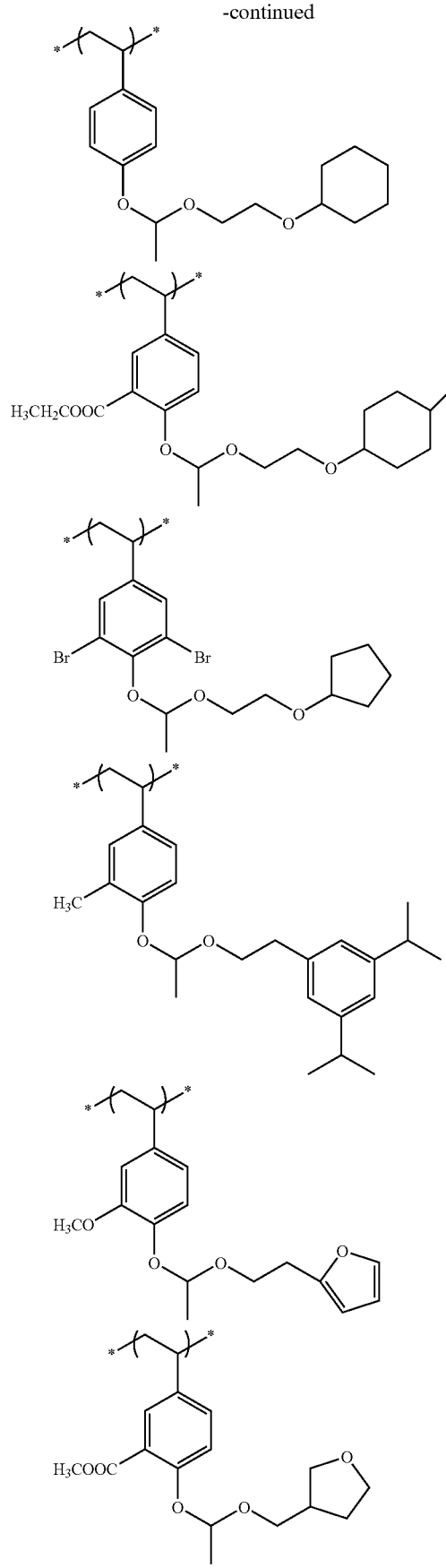
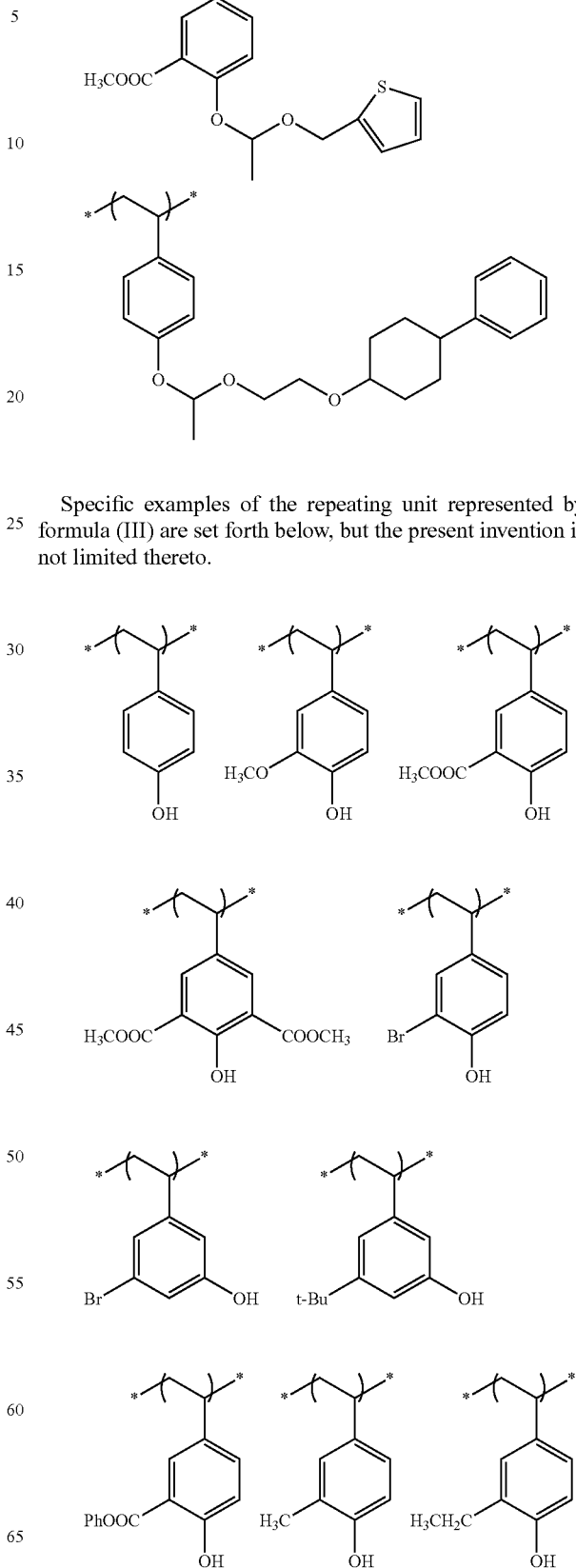
Specific examples of the repeating unit represented by formula (III) are set forth below, but the present invention is not limited thereto.

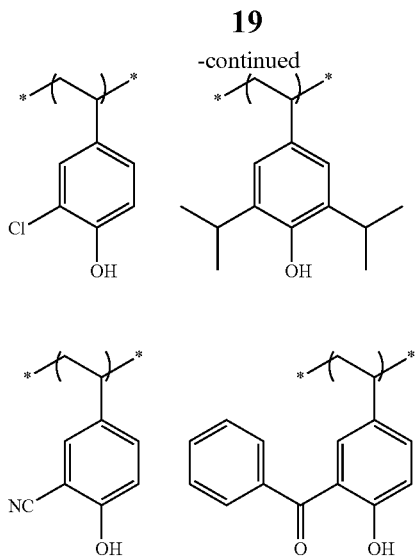

Each $R_{01}$ in formula (IV) independently represents a hydrogen atom, an alkyl group, a cycloalkyl group, a halogen atom, a cyano group or an alkoxycarbonyl group and preferably has a carbon number of 20 or less, and examples thereof are the same as those of $R_{01}$ in formula (II) or (III).

The acyl group, alkyl group, alkoxy group, acyloxy group and alkoxycarbonyl group as B in formula (IV) are the same as respective groups for A in formula (II), and B is preferably an acyloxy group or an alkoxycarbonyl group, more preferably an acyloxy group. Among the acyloxy groups (represented by the formula: —O—CO—$R_4$, wherein $R_4$ is an alkyl group), those where the carbon number of $R_4$ is from 1 to 6 are preferred, those where the carbon number of $R_4$ is from 1 to 3 are more preferred, and the acyloxy group where the carbon number of $R_4$ is 1 (that is, an acetoxy group) is still more preferred.

p represents an integer of 0 to 5 and is preferably an integer of 0 to 2, more preferably 1 or 2, still more preferably 1.

These groups each may have a substituent, and preferred examples of the substituent include a hydroxyl group, a carboxyl group, a cyano group, a halogen atom (fluorine, chlorine, bromine, iodine) and an alkoxy group (e.g., methoxy, ethoxy, propoxy, butoxy). As for the cyclic structure, examples of the substituent further include an alkyl group (preferably having a carbon number of 1 to 8).

Specific examples of the repeating unit represented by formula (IV) are set forth below, but the present invention is not limited thereto.

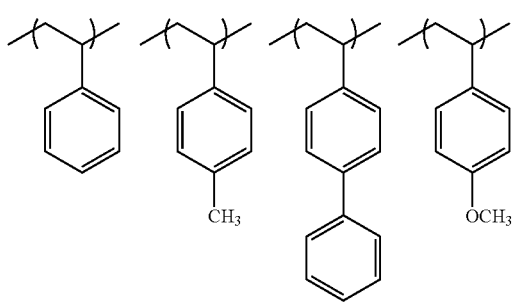

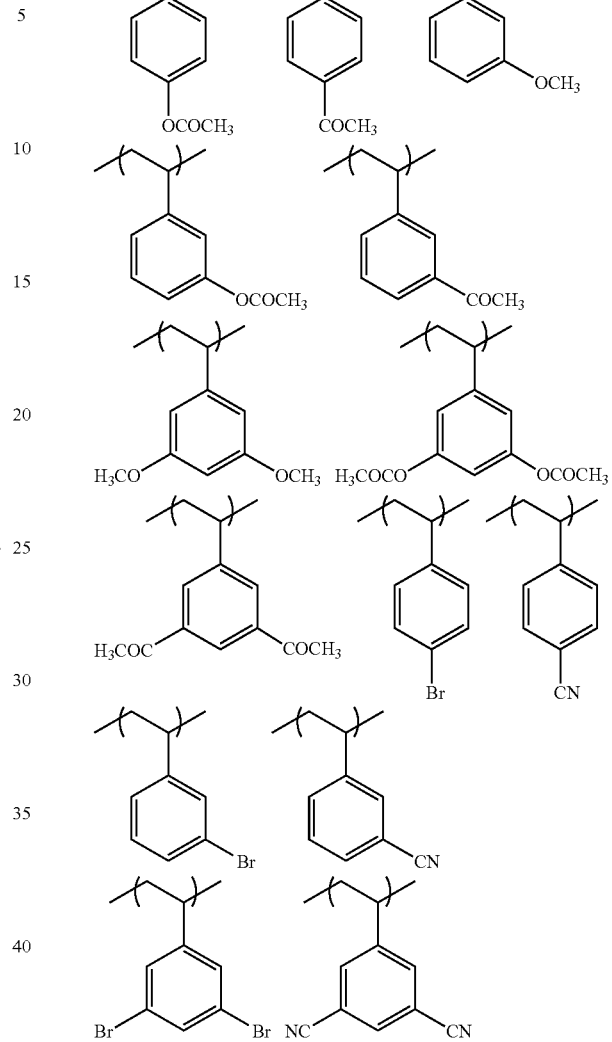

The resin (A1) may contain a repeating unit represented by the following formula (V):

In formula (V), Ra to Rc each independently represents a hydrogen atom, a fluorine atom, a chlorine atom, a cyano group or an alkyl group.

$X_1$ represents a hydrogen atom or an organic group.

In formula (V), the alkyl group as Ra to Rc is preferably an alkyl group having a carbon number of 1 to 5, and examples thereof include a methyl group, an ethyl group and a propyl group.

The organic group as $X_1$ preferably has a carbon number of 1 to 40 and may be an acid-decomposable group or a non-acid-decomposable group.

Examples of the non-acid-decomposable group include an alkyl group, a cycloalkyl group, an alkenyl group and an aryl group.

In the non-acid-decomposable group, the alkyl group is preferably an alkyl group having a carbon number of 1 to 4, such as methyl group, ethyl group, propyl group, n-butyl group and sec-butyl group; the cycloalkyl group is preferably a cycloalkyl group having a carbon number of 3 to 10, such as cyclopropyl group, cyclobutyl group, cyclohexyl group and adamantyl group; the alkenyl group is preferably an alkenyl group having a carbon number of 2 to 4, such as vinyl group, propenyl group, allyl group and butenyl group; the aryl group is preferably an aryl group having a carbon number of 6 to 14, such as phenyl group, xylyl group, toluoyl group, cumenyl group, naphthyl group and anthracenyl group.

Examples of the acid-decomposable group as the organic group of $X_1$ include —$C(R_{11a})(R_{12a})(R_{13a})$, —$C(R_{14a})(R_{15a})(OR_{16a})$ and —CO—OC$(R_{11a})(R_{12a})(R_{13a})$.

$R_{11a}$ to $R_{13a}$ each independently represents an alkyl group, a cycloalkyl group, an alkenyl group, an aralkyl group or an aryl group. $R_{14a}$ and $R_{15a}$ each independently represents a hydrogen atom or an alkyl group. $R_{16a}$ represents an alkyl group, a cycloalkyl group, an alkenyl group, an aralkyl group or an aryl group. Two members out of $R_{11a}$, $R_{12a}$ and $R_{13a}$ or two members out of $R_{14a}$, $R_{15a}$ and $R_{16a}$ may combine to form a ring.

Also, a group having an acid-decomposable group may be introduced into $X_1$ by modification. $X_1$ having introduced thereinto an acid-decomposable group is, for example, represented by the following formula:

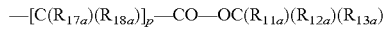
—[C$(R_{17a})(R_{18a})]_p$—CO—OC$(R_{11a})(R_{12a})(R_{13a})$ wherein $R_{17a}$ and $R_{18a}$ each independently represents a hydrogen atom or an alkyl group, and p represents an integer of 1 to 4.

The organic group as $X_1$ is preferably an acid-decomposable group having at least one cyclic structure selected from an alicyclic structure, an aromatic cyclic structure and a crosslinked alicyclic structure, and the structure is preferably a structure containing an aromatic group (particularly phenyl group) or a structure containing an alicyclic or crosslinked alicyclic structure represented by the following formulae (pI) to (pVI):

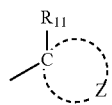

(pI)

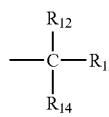

(pII)

(pIII)

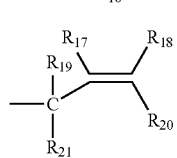

(pIV)

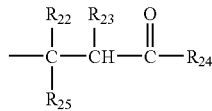

(pV)

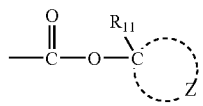

(pVI)

In formulae, $R_{11}$ represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

$R_{12}$ to $R_{16}$ each independently represents a linear or branched alkyl group having a carbon number of 1 to 4 or an alicyclic hydrocarbon group, provided that at least one of $R_{12}$ to $R_{14}$ or either one of $R_{15}$ and $R_{16}$ represents an alicyclic hydrocarbon group.

$R_{17}$ to $R_{21}$ each independently represents a hydrogen atom, a linear or branched alkyl group having a carbon number of 1 to 4 or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having a carbon number of 1 to 4 or an alicyclic hydrocarbon group.

$R_{22}$ to $R_{25}$ each independently represents a hydrogen atom, a linear or branched alkyl group having a carbon number of 1 to 4 or an alicyclic hydrocarbon group, provided that at least one of $R_{22}$ to $R_{25}$ represents an alicyclic hydrocarbon group, and $R_{23}$ and $R_{24}$ may combine with each other to form a ring.

In formulae (pI) to (pVI), the alkyl group of $R_{12}$ to $R_{25}$ is a linear or branched alkyl group having a carbon number of 1 to 4, which may be substituted or unsubstituted, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may further have include an alkoxy group having a carbon number of 1 to 4, a halogen atom (fluorine, chlorine, bromine, iodine), an acyl group, an acyloxy group, a cyano group, a hydroxyl group, a carboxy group, an alkoxycarbonyl group and a nitro group.

The alicyclic hydrocarbon group of $R_{11}$ to $R_{25}$ and the alicyclic hydrocarbon group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25. These alicyclic hydrocarbon groups each may have a substituent.

Examples of the structure of the alicyclic moiety in the alicyclic hydrocarbon group are set forth below.

(1)

(2)

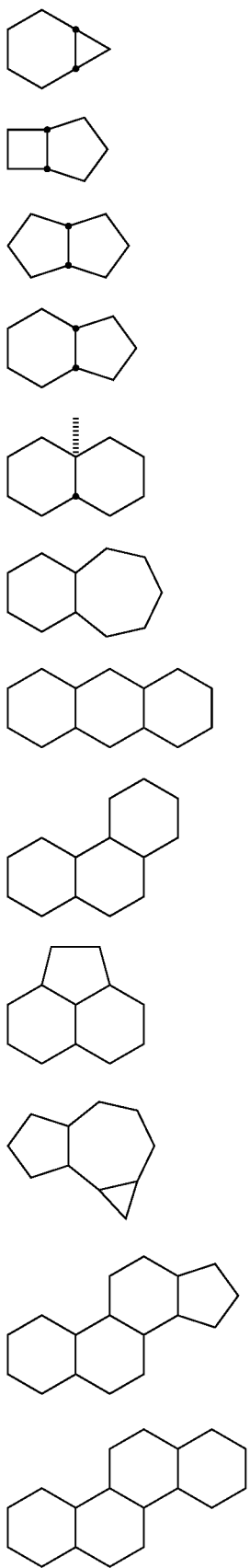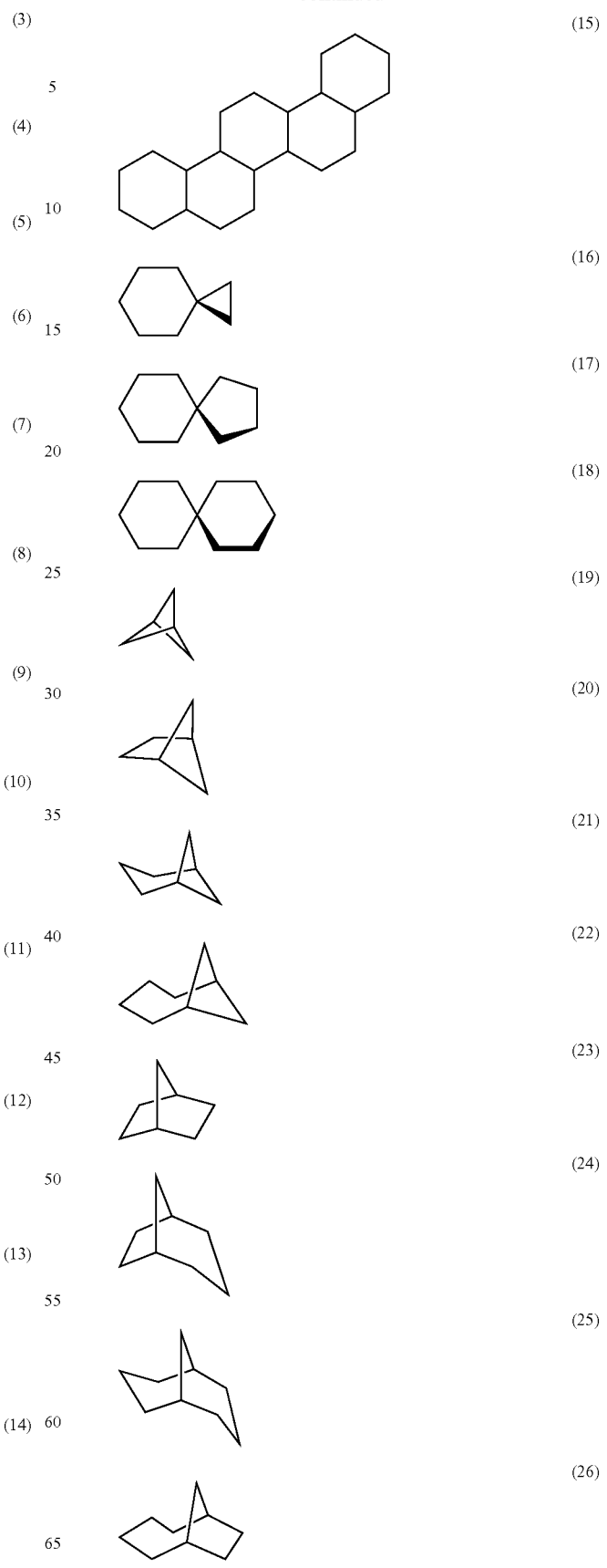

-continued

(27) 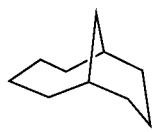

(28) 

(29) 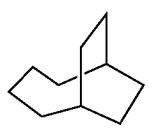

(30) 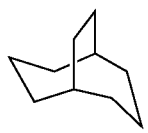

(31) 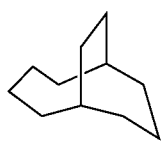

(32) 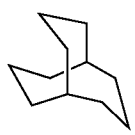

(33) 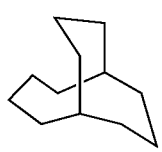

(34) 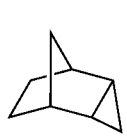

(35) 

(36) 

(37) 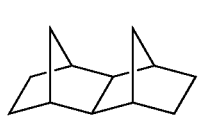

(38) 

-continued

(39) 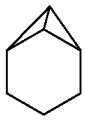

(40) 

(41) 

(42) 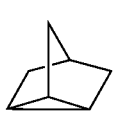

(43) 

(44) 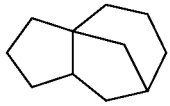

(45) 

(46) 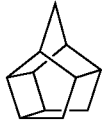

(47) 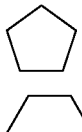

(48) 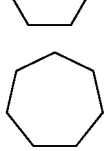

(49) 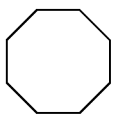

(50)

In the present invention, preferred examples of the alicyclic moiety include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alicyclic hydrocarbon group may have include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a substituent selected from the group consisting of a methyl group, an ethyl group, a propyl group and an isopropyl group. Examples of the alkoxy group include an alkoxy group having a carbon number of 1 to 4, such as methoxy group, ethoxy group, propoxy group and butoxy group.

The alkyl group, alkoxy group and alkoxycarbonyl group each may further have a substituent, and examples of the substituent include an alkoxy group having a carbon number of 1 to 4 (e.g., methoxy, ethoxy, butoxy), a hydroxy group, an oxo group, an alkylcarbonyl group (preferably having a carbon number of 2 to 5), an alkylcarbonyloxy group (preferably having a carbon number of 2 to 5), an alkyloxycarbonyl group (preferably having a carbon number of 2 to 5) and a halogen atom (e.g., chlorine, bromine, fluorine).

In the resin (A1), for maintaining good developability with an alkali developer, another appropriate polymerizable monomer may be copolymerized so that an alkali-soluble group such as phenolic hydroxyl group, carboxyl group, sulfonic acid group and hexafluoroisopropanol group ($-C(CF_3)_2OH$) can be introduced, or for enhancing the film quality, another hydrophobic polymerizable monomer such as alkyl acrylate and alkyl methacrylate may be copolymerized.

The content of the repeating unit represented by formula (II) is preferably from 5 to 60 mol %, more preferably from 10 to 50 mol %, still more preferably from 10 to 40 mol %, based on all repeating units constituting the resin.

The content of the repeating unit represented by formula (III) is preferably from 40 to 90 mol %, more preferably from 45 to 80 mol %, still more preferably from 50 to 75 mol %, based on all repeating units constituting the resin.

The content of the repeating unit represented by formula (IV) is preferably from 0 to 50 mol %, more preferably from 10 to 40 mol %, still more preferably from 15 to 30 mol %, based on all repeating units constituting the resin.

The content of the repeating unit represented by formula (V) is preferably from 0 to 30 mol %, more preferably from 0 to 20 mol %, still more preferably from 0 to 10 mol %, based on all repeating units constituting the resin.

The content of the repeating unit having an alkali-soluble group except for a hydroxyl group, such as carboxy group and sulfonic acid group, is preferably from 0 to 10 mol %, more preferably from 1 to 8 mol %, still more preferably from 2 to 6 mol %, based on all repeating units constituting the resin.

The content of the repeating unit having an acid-decomposable group is preferably from 5 to 60 mol %, more preferably from 10 to 55 mol %, still more preferably from 10 to 50 mol %, based on all repeating units constituting the resin (A1).

The resin (A1) may be synthesized by a known synthesis method as described in European Patent 254853, JP-A-2-258500, JP-A-3-223860 and JP-A-4-251259, such as a method of reacting a precursor of a group capable of decomposing under the action of an acid with an alkali-soluble resin or a method of copolymerizing a monomer having a group capable of decomposing under the action of an acid with various monomers.

The weight average molecular weight of the resin (A1) is, in terms of a polystyrene-reduced value by the GPC method, preferably 15,000 or less, more preferably from 1,000 to 10,000, still more preferably from 1,500 to 5,000, yet still more preferably from 2,000 to 3,000.

The dispersity (Mw/Mn) of the resin (A1) is preferably from 1.0 to 3.0, more preferably from 1.05 to 2.0, still more preferably from 1.1 to 1.7.

As for the resin (A1), two or more kinds of resins may be used in combination.

Specific examples of the resin (A1) are set forth below, but the present invention is not limited thereto.

(1)

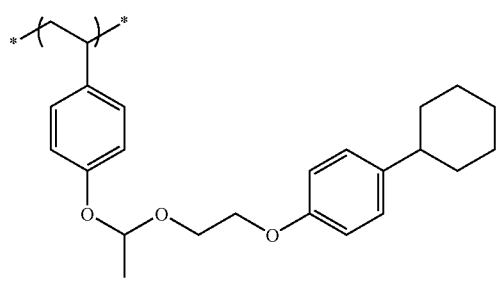

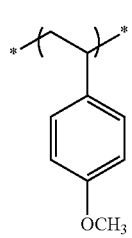

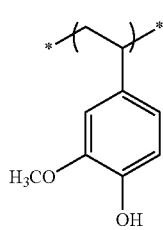

(2)

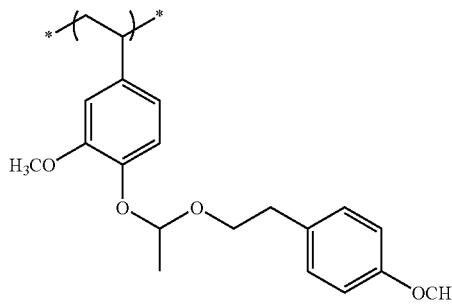

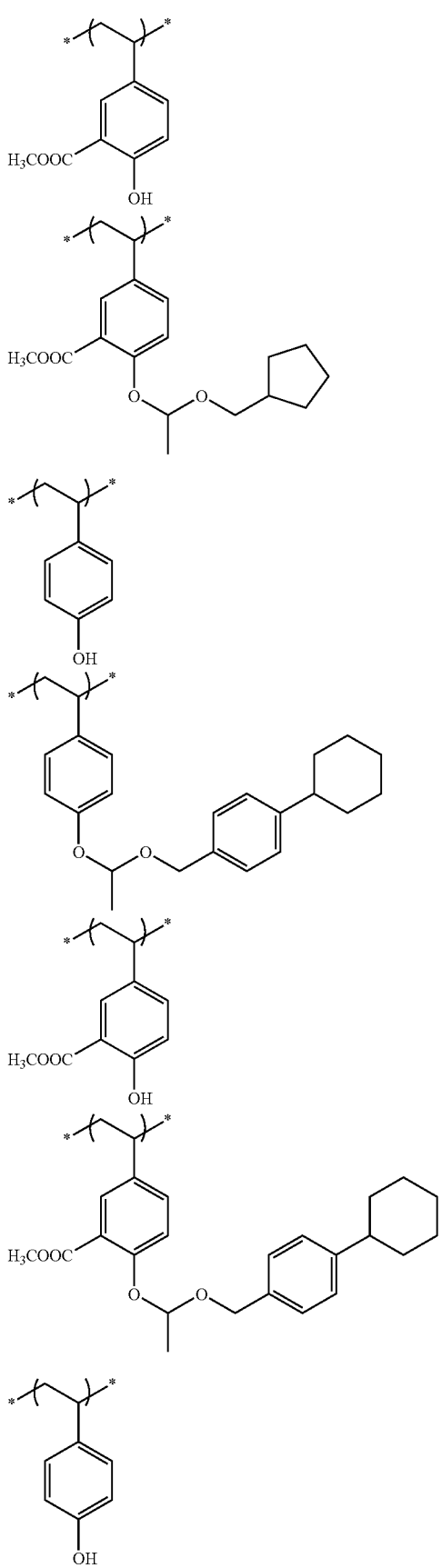

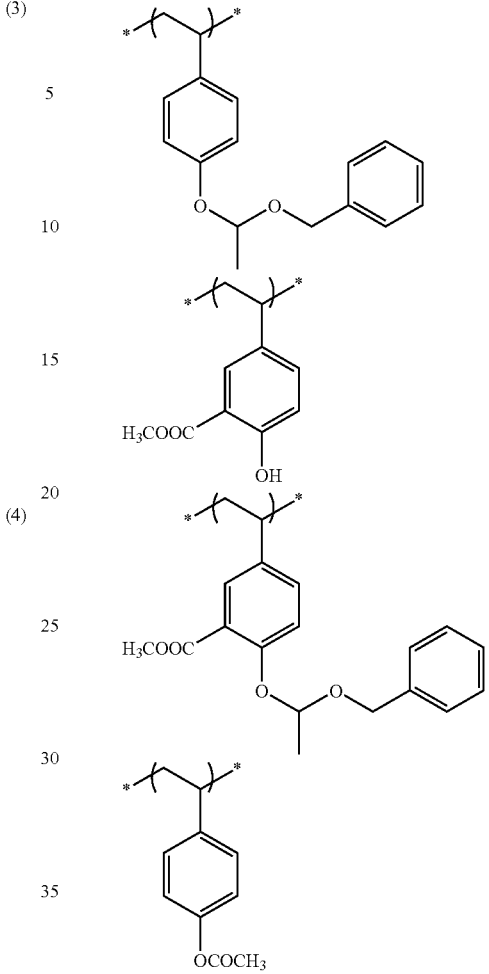

In the positive resist composition of the present invention, the amount of the acid-decomposable resin blended in the composition is preferably from 45 to 90 mass %, more preferably from 55 to 85 mass %, still more preferably from 60 to 80 mass %, based on the entire solid content of the composition. (In this specification, mass ratio is equal to weight ratio.)

[2] (B) Compound Capable of Generating an Acid Upon Irradiation with Actinic Rays or Radiation (Acid Generator)

The acid generator which can be used may be appropriately selected from a photoinitiator for photocationic polymerization, a photoinitiator for photoradical polymerization, a photo-decoloring agent for coloring matters, a photo-discoloring agent, a compound known to generate an acid upon irradiation with actinic rays or radiation and used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Also, a compound where such a group or compound capable of generating an acid upon irradiation with actinic rays or radiation is introduced into the main or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with actinic rays or radiation, the compounds represented by the following formulae (ZI), (ZII) and (ZIII) are preferred.

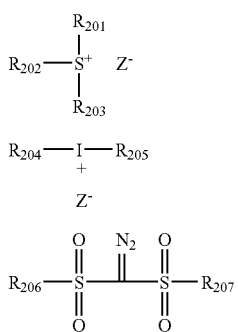

In formula (ZI), $R_{201}$, $R_{202}$ and $R_{203}$ each independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methyl anion.

The non-nucleophilic anion is an anion having an extremely low ability of causing a nucleophilic reaction and this anion can suppress the decomposition with aging due to intramolecular nucleophilic reaction. By virtue of this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group and is preferably an alkyl group having a carbon number of 1 to 30 or a cycloalkyl group having a carbon number of 3 to 30. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion each may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylmethyl group.

The alkyl group, cycloalkyl group, aryl group and aralkyl group in the aliphatic carboxylate anion, aromatic carboxylate anion and aralkylcarboxylate anion each may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group and an alkylthio group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a group having a fluorine atom, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl group or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group or cycloalkyl group of $R_{201}$ to $R_{203}$ is preferably a linear or branched alkyl group having a carbon number of 1 to 10 (e.g., methyl, ethyl, propyl, butyl, pentyl) or a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

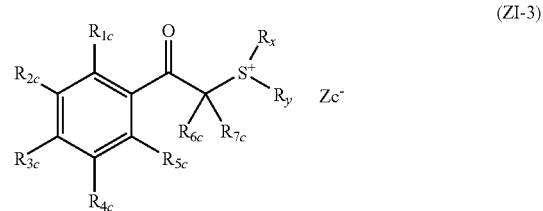

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine with each other to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ and $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group or cycloalkyl group in $R_{204}$ to $R_{207}$ is preferably a linear or branched alkyl group having a carbon number of 1 to 10 (e.g., methyl, ethyl, propyl, butyl, pentyl) or a cycloalkyl group having a carbon number of 3 to 10 (e.g., cyclopentyl, cyclohexyl, norbornyl).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the compound capable of generating an acid upon irradiation with actinic rays or radiation, which can be used, include the compounds represented by the following formulae (ZIV), (ZV) and (ZVI).

ZIV

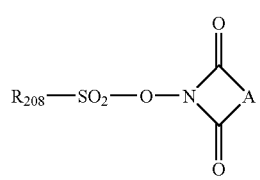

ZV

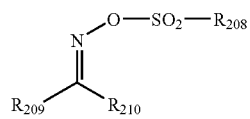

ZVI

In formulae (ZIV) to (ZVI), $Ar_3$ and $Ar_4$ each independently represents an aryl group.

$R_{208}$, $R_{209}$ and $R_{210}$ each independently represents an alkyl group, a cycloalkyl group or an aryl group.

A represents an alkylene group, an alkenylene group or an arylene group.

Among the compounds capable of generating an acid upon irradiation with actinic rays or radiation, more preferred are the compounds represented by formulae (ZI) to (ZIII).

The compound capable of generating an acid upon irradiation with actinic rays or radiation is preferably a compound that generates an acid having one sulfonic acid group or imide group, more preferably a compound that generates a monovalent perfluoroalkanesulfonic acid, a compound that generates an aromatic sulfonic acid substituted by a monovalent fluorine atom or a fluorine atom-containing group, or a compound that generates an imide acid substituted by a monovalent fluorine atom or a fluorine atom-containing group, still more preferably a sulfonium salt of fluoro-substituted alkanesulfonic acid, fluorine-substituted benzenesulfonic acid or fluorine-substituted imide acid. In particular, the acid generated from the acid generator which can be used is preferably a fluoro-substituted alkanesulfonic acid, fluoro-substituted benzenesulfonic acid or fluoro-substituted imide acid having a pKa of −1 or less and in this case, the sensitivity can be enhanced.

Among the compounds capable of generating an acid upon irradiation with actinic rays or radiation, particularly preferred compounds are set forth below.

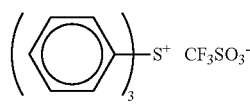

(z1)

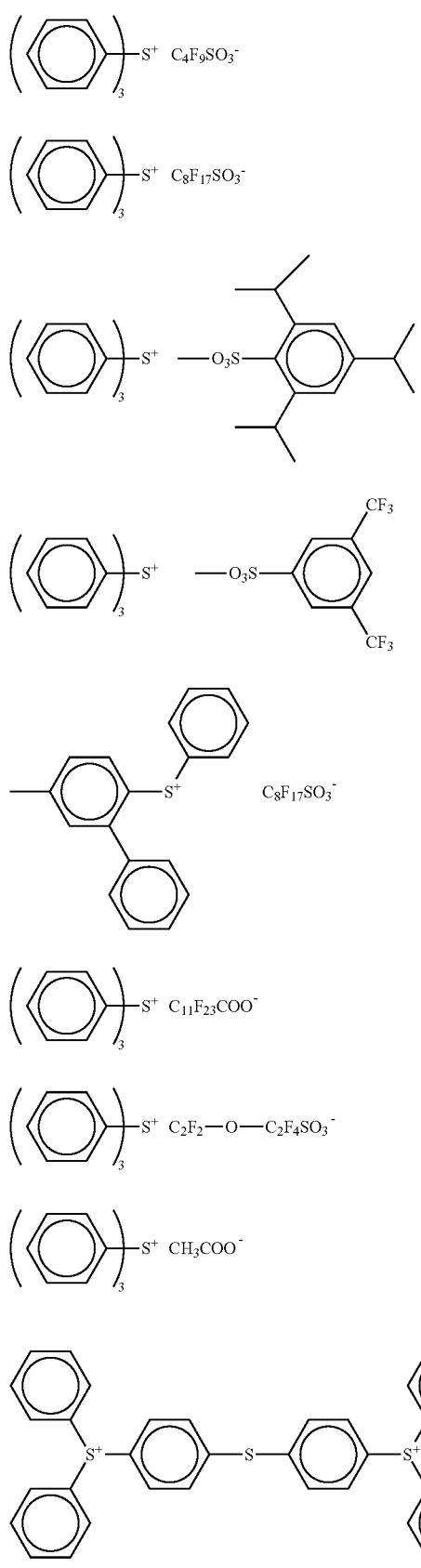
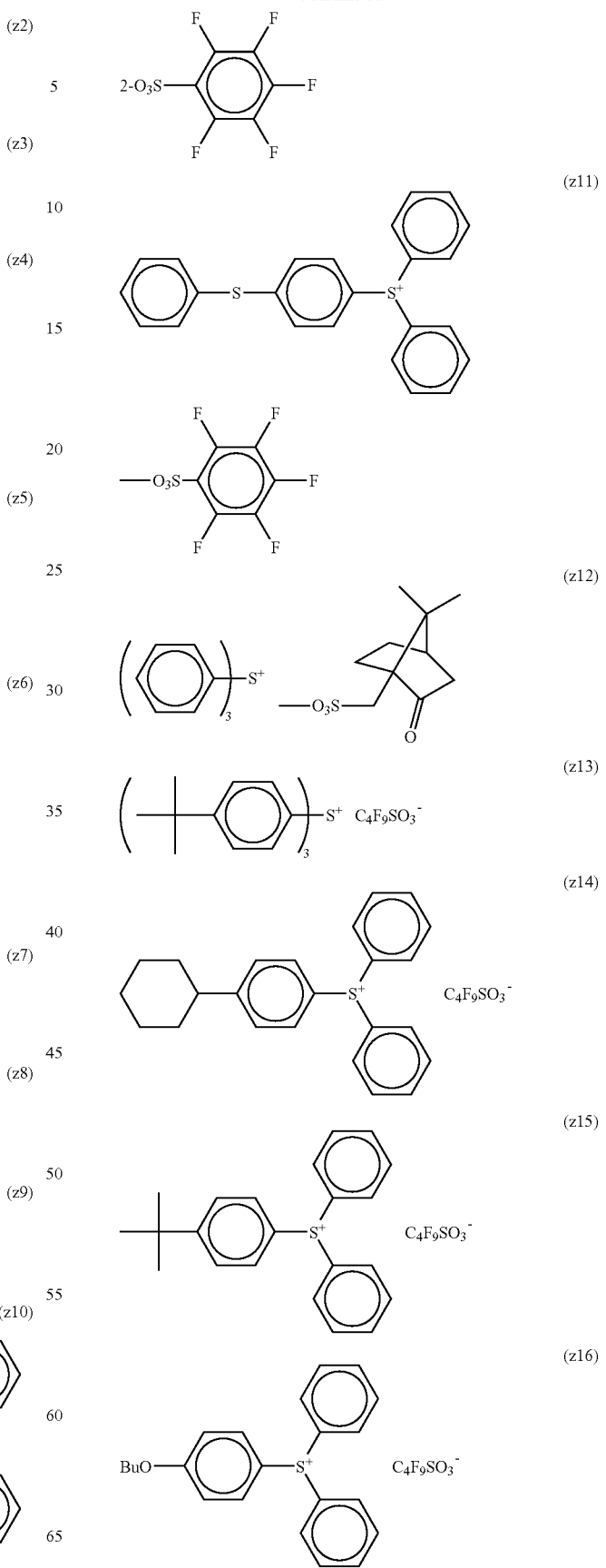

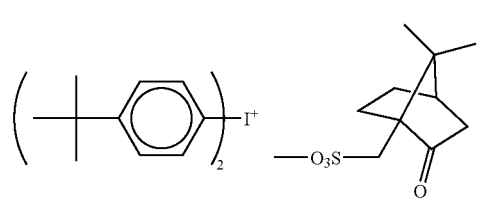 (z17)
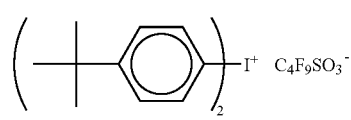 (z18)
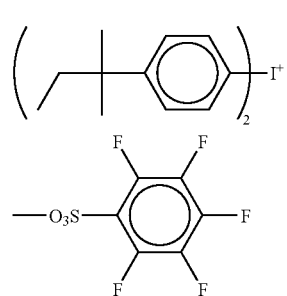 (z19)
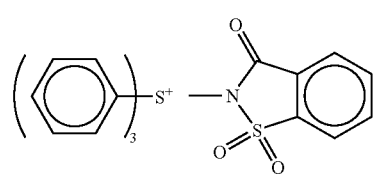 (z20)
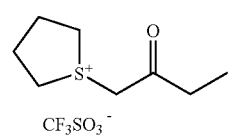 (z21)
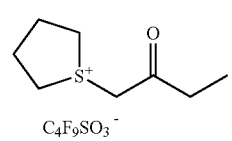 (z22)
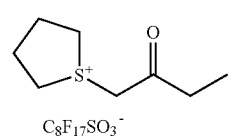 (z23)
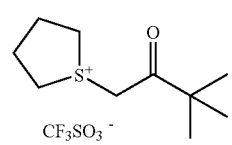 (z24)
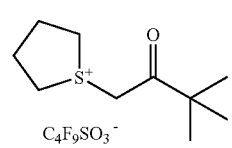 (z25)
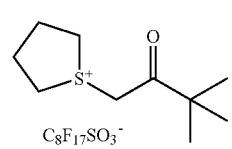 (z26)
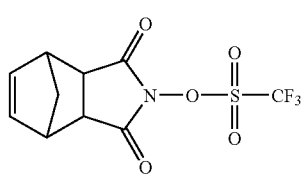 (z27)
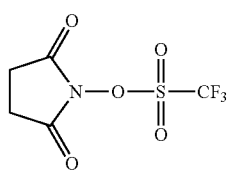 (z28)
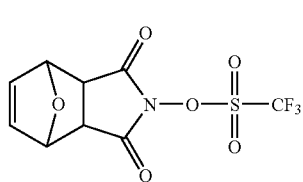 (z29)
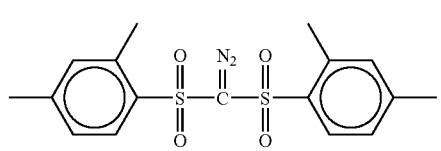 (z30)
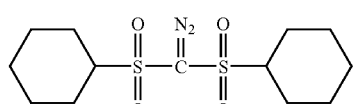 (z31)
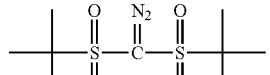 (z32)
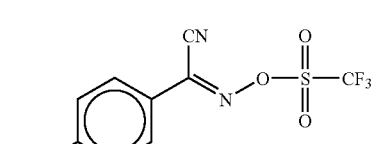 (z33)
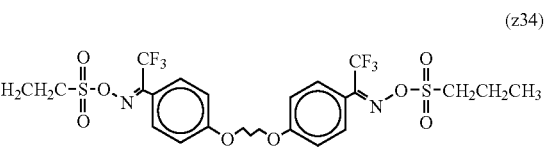 (z34)
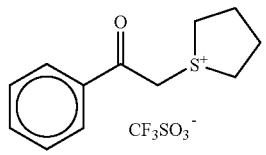 (z35)
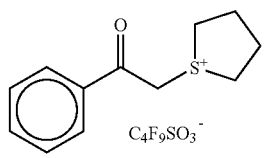 (z36)

-continued
(z37) 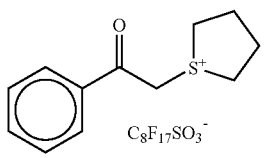
(z38) 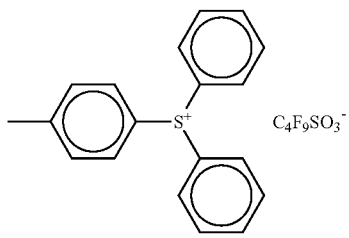
(z39) 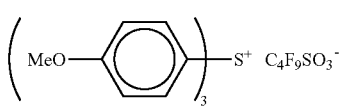
(z40) 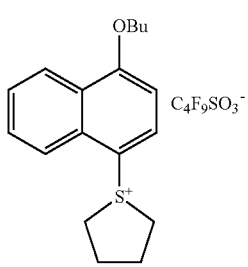
(z41) 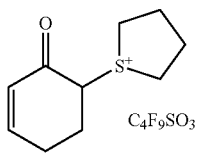
(z42) 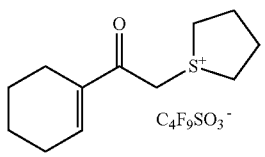
(z43) 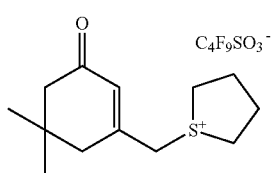
(z44) 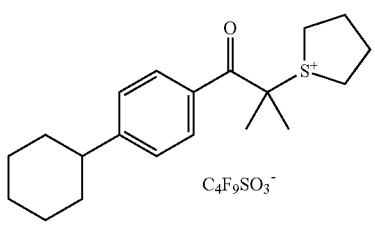
-continued
(z45) 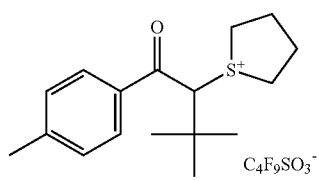
(z46) 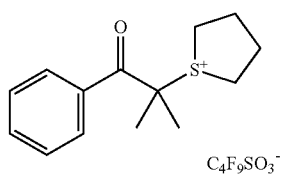
(z47) 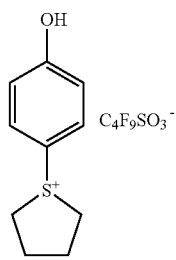
(z48) 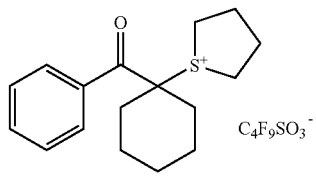
(z49) 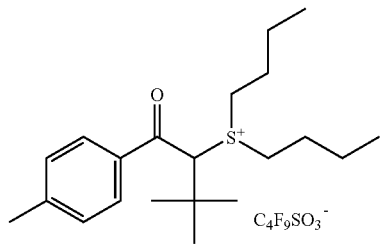
(z50) 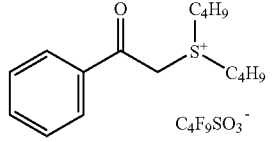
(z51) 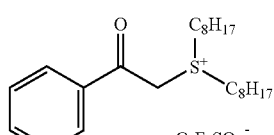
(z52) 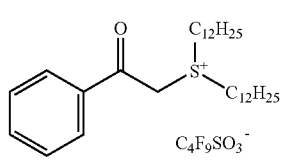

-continued
(z53) 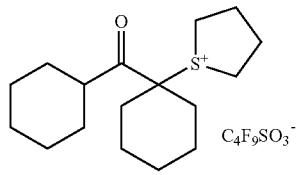
(z54) 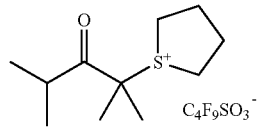
(z55) 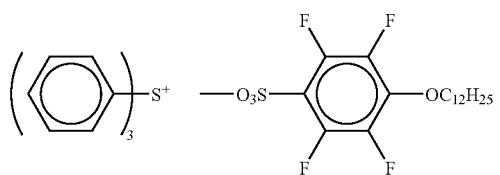
(z56) 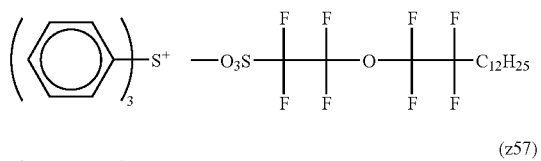
(z57) 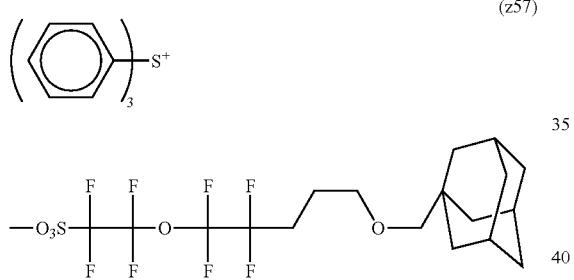
(z58) 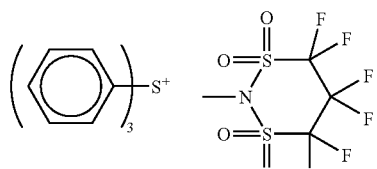
(z59) 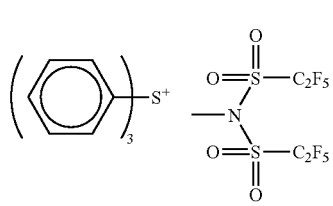
(z60) 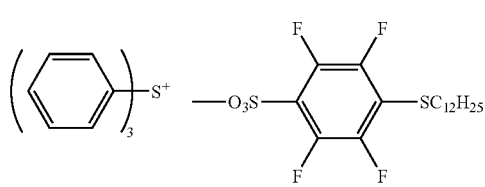
-continued
(z61) 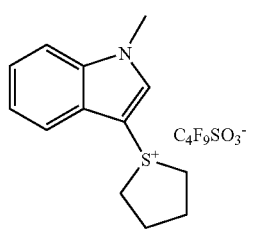
(z62) 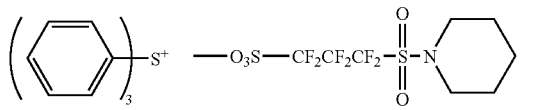
(z63) 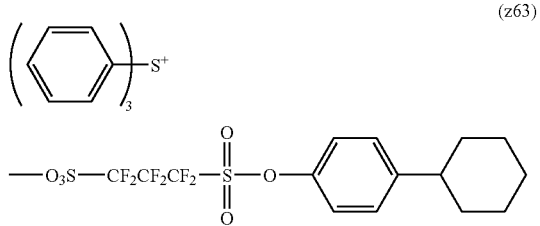
(z64) 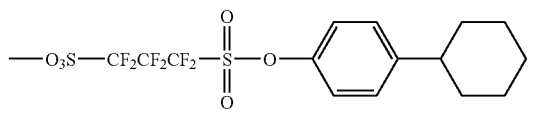
(z65) 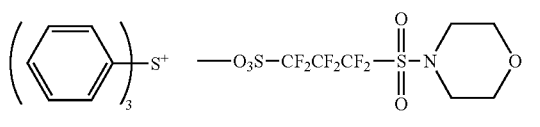
(z66) 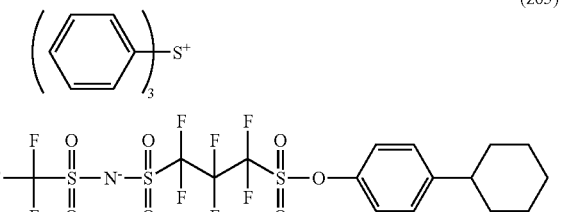
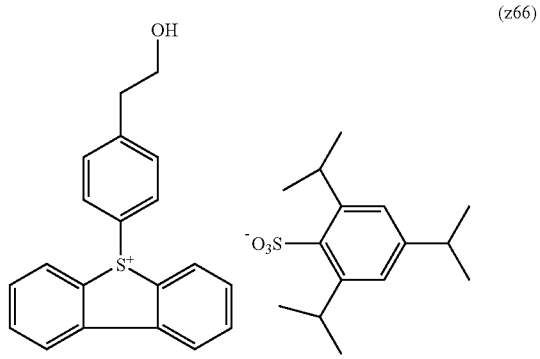
(z67) 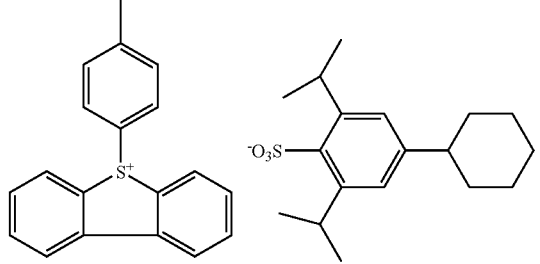

-continued (z68)

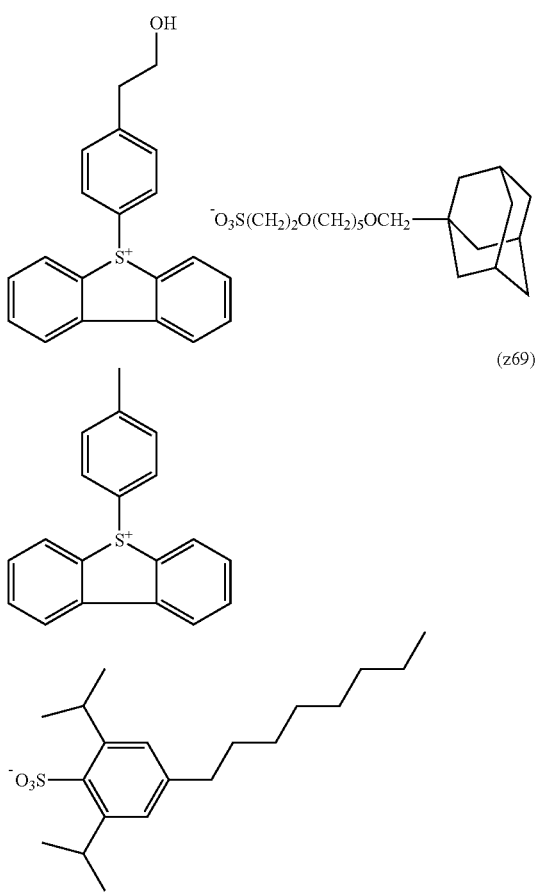

(z69)

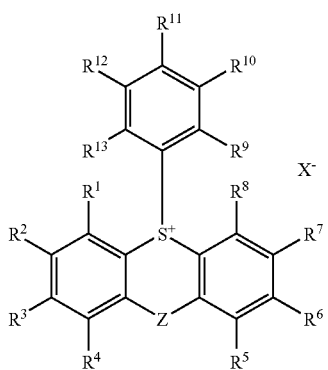

In particular, the acid generator is preferably a compound represented by formula (I) (acid generator A1).

(I)

[Structure of formula (I) showing a thianthrenium cation with substituents $R^1$ through $R^{13}$, a linking group Z, and counter anion $X^-$]

In formula (I), $R^1$ to $R^{13}$ each independently represents a hydrogen atom or a substituent. Z represents a single bond or a divalent linking group.

$X^-$ represents a counter anion.

In formula (I), at least one of $R^1$ to $R^{13}$ is preferably a substituent containing an alcoholic hydroxyl group. In the case where at least one of $R^1$ to $R^{13}$ is a substituent containing an alcoholic hydroxyl group (the "alcoholic hydroxyl group" indicates a hydroxyl group bonded to a carbon atom of an alkyl group), $R^1$ to $R^{13}$ each is represented by —W—Y, wherein Y is an alkyl group substituted by a hydroxyl group and W is a single bond or a divalent linking group.

Examples of the alkyl group of Y include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a boronyl group. Among these, preferred are an ethyl group, a propyl group, an isopropyl group, an n-butyl group, an isobutyl group and a sec-butyl group, and more preferred are an ethyl group, a propyl group and an isopropyl group. In particular, Y preferably has a structure of —$CH_2CH_2OH$.

The divalent linking group represented by W is not particularly limited and includes, for example, a divalent group obtained by substituting a single bond for an arbitrary hydrogen atom of a monovalent group such as alkoxyl group, acyloxy group, carbamoyloxy group, alkoxycarbonyloxy group, aryloxycarbonyloxy group, acylamino group, aminocarbonylamino group, alkoxycarbonylamino group, aryloxycarbonylamino group, sulfamoylamino group, alkylsulfonylamino group, arylsulfonylamino group, alkylthio group, arylthio group, sulfamoyl group, alkylsulfinyl group, arylsulfinyl group, alkylsulfonyl group, arylsulfonyl group, acyl group, aryloxycarbonyl group, alkoxycarbonyl group and carbamoyl group.

W is preferably a single bond or a divalent group obtained by substituting a single bond for an arbitrary hydrogen atom of an alkoxyl group, an acyloxy group, an acylamino group, an alkylsulfonylamino group, an arylsulfonylamino group, an alkylthio group, an alkylsulfonyl group, an acyl group, an alkoxycarbonyl group or a carbamoyl group, more preferably a single bond or a divalent group obtained by substituting a single bond for an arbitrary hydrogen atom of an acyloxy group, an alkylsulfonyl group, an acyl group or an alkoxycarbonyl group.

In the case where $R^1$ to $R^{13}$ each is a substituent containing an alcoholic hydroxyl group, the number of carbon atoms contained is preferably from 2 to 10, more preferably from 2 to 6, still more preferably from 2 to 4.

The substituent as $R^1$ to $R^{13}$ containing an alcoholic hydroxyl group may have two or more alcoholic hydroxyl groups. The number of alcoholic hydroxyl groups in the substituent as $R^1$ to $R^{13}$ containing an alcoholic hydroxyl group is from 1 to 6, preferably from 1 to 3, more preferably 1.

The number of alcoholic hydroxyl groups in the compound represented by formula (I) is, in total of $R^1$ to $R^{13}$, from 1 to 10, preferably from 1 to 6, more preferably from 1 to 3.

In the case where $R^1$ to $R^{13}$ each does not contain an alcoholic hydroxyl group, $R^1$ to $R^{13}$ each independently represents a hydrogen atom or a substituent, and the substituent may be any substituent and is not particularly limited, but examples thereof include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may be called a hetero ring group), a cyano group, a nitro group, a carboxyl group, an alkoxyl group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents.

Two adjacent members out of $R^1$ to $R^{13}$ may combine to form a ring (an aromatic or non-aromatic hydrocarbon ring or a heterocyclic ring, which may be further combined to form a polycyclic condensed ring; such as benzene ring, naphthalene ring, anthracene ring, phenanthrene ring, fluorene ring, triphenylene ring, naphthacene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, quinolizine ring, quinoline ring, phthalazine ring, naphthyridine ring, quinoxaline ring, quinoxazoline ring, isoquinoline ring, carbazole ring, phenanthridine ring, acridine ring, phenanthroline ring, thianthrene ring, chromene ring, xanthene ring, phenoxathiin ring, phenothiazine ring and phenazine ring).

In the case where $R^1$ to $R^{13}$ each does not contain an alcoholic hydroxyl group, $R^1$ to $R^{13}$ each is preferably a hydrogen atom, a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a sulfamoyl group, an alkylsulfonyl group, an arylsulfonyl group, an aryloxycarbonyl group, an alkoxycarbonyl group, a carbamoyl group, an imido group, a silyl group, or a ureido group.

In the case where $R^1$ to $R^{13}$ each does not contain an alcoholic hydroxyl group, $R^1$ to $R^{13}$ each is more preferably a hydrogen atom, a halogen atom, an alkyl group (including a cycloalkyl group, a bicycloalkyl group and a tricycloalkyl group), a cyano group, an alkoxy group, an acyloxy group, an acylamino group, an aminocarbonylamino group, an alkoxycarbonylamino group, an alkylsulfonylamino group, an arylsulfonylamino group, an alkylthio group, a sulfamoyl group, an alkylsulfonyl group, an arylsulfonyl group, an alkoxycarbonyl group, or a carbamoyl group.

In the case where $R^1$ to $R^{13}$ each does not contain an alcoholic hydroxyl group, $R^1$ to $R^{13}$ each is still more preferably a hydrogen atom, an alkyl group (including a cycloalkyl group, a bicycloalkyl group and a tricycloalkyl group), a halogen atom, or an alkoxy group.

In formula (I), at least one of $R^1$ to $R^{13}$ contains an alcoholic hydroxyl group, and preferably, at least one of $R^9$ to $R^{13}$ contains an alcoholic hydroxyl group.

Z represents a single bond or a divalent linking group, and examples of the divalent linking group include an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH=CH—, —C≡C—, an aminocarbonylamino group, and an aminosulfonylamino group, which groups each may have a substituent. Examples of the substituent therefor are the same as those of the substituent described for $R^1$ to $R^{13}$. Z is preferably a single bond or a non-electron-withdrawing substituent such as alkylene group, arylene group, ether group, thioether group, amino group, —CH=CH—, —C≡C—, aminocarbonylamino group and aminosulfonylamino group, more preferably a single bond, an ether group or a thioether group, still more preferably a single bond.

The compound represented by formula (I) has a counter anion X$^-$. The anion is preferably an organic anion. The organic anion indicates an anion containing at least one carbon atom. Furthermore, the organic anion is preferably a non-nucleophilic anion. The non-nucleophilic anion is an anion which has extremely low ability of causing a nucleophilic reaction and can suppress the decomposition with aging due to an intramolecular nucleophilic reaction.

Examples of the non-nucleophilic anion include a sulfonate anion, a carboxylate anion, a sulfonylimide anion, a bis(alkylsulfonyl)imide anion and a tris(alkylsulfonyl)methyl anion.

Examples of the non-nucleophilic sulfonate anion include an alkylsulfonate anion, an arylsulfonate anion, and a camphorsulfonate anion. Examples of the non-nucleophilic carboxylate anion include an alkylcarboxylate anion, an arylcarboxylate anion, and an aralkylcarboxylate anion.

The alkyl moiety in the alkylsulfonate anion may be an alkyl group or a cycloalkyl group and is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a boronyl group.

The aryl group in the arylsulfonate anion is preferably an aryl group having a carbon number of 6 to 14, such as phenyl group, tolyl group and naphthyl group.

Examples of the substituent for the alkyl group, cycloalkyl group and aryl group in the alkylsulfonate anion and arylsulfonate anion include a nitro group, a halogen atom (fluorine, chlorine, bromine, iodine), a carboxyl group, a hydroxyl group, an amino group, a cyano group, an alkoxyl group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7). As for the aryl group or ring structure of each group, examples of the substituent further include an alkyl group (preferably having a carbon number of 1 to 15).

The alkyl moiety in the alkylcarboxylate anion is the same as the alkyl group or cycloalkyl group in the alkylsulfonate anion. The aryl group in the arylcarboxylate anion is the same as aryl group in the arylsulfonate anion. The aralkyl group in the aralkylcarboxylate anion is preferably an aralkyl group having a carbon number of 6 to 12, and examples thereof include a benzyl group, a phenethyl group, a naphthylmethyl group, and a naphthylethyl group.

Examples of the substituent of the alkyl group, cycloalkyl group, aryl group and aralkyl group in the alkylcarboxylate anion, arylcarboxylate anion and aralkylcarboxylate anion include a halogen atom, an alkyl group, a cycloalkyl group, an alkoxyl group and an alkylthio group, which are the same as those in the arylsulfonate anion. Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group and an alkylthio group.

Other examples of the non-nucleophilic anion include fluorinated phosphorus, fluorinated boron and fluorinated antimony.

The counter anion $X^-$ of the compound represented by formula (I) is preferably a sulfonate anion, more preferably an arylsulfonate anion.

Specific examples of the counter anion include methanesulfonate anion, trifluoromethanesulfonate anion, pentafluoroethanesulfonate anion, heptafluoropropanesulfonate anion, perfluorobutanesulfonate anion, perfluorohexanesulfonate anion, perfluorooctanesulfonate anion, pentafluorobenzenesulfonate anion, 3,5-bistrifluoromethylbenzenesulfonate anion, 2,4,6-triisopropylbenzenesulfonate anion, perfluoroethoxyethanesulfonate anion, 2,3,5,6-tetrafluoro-4-dodecyloxybenzenesulfonate anion, p-toluenesulfonate anion, and 2,4,6-trimethylbenzenesulfonate anion.

The molecular weight of the compound represented by formula (I) is preferably from 200 to 2,000, more preferably from 400 to 1,000.

The compound represented by formula (I) can be synthesized, for example, by a method of condensing a cyclic sulfoxide compound to a benzene derivative containing, as the substituent, a hydroxyl group protected by a protective group, thereby forming a sulfonium salt, and deprotecting the protective group of the hydroxyl group.

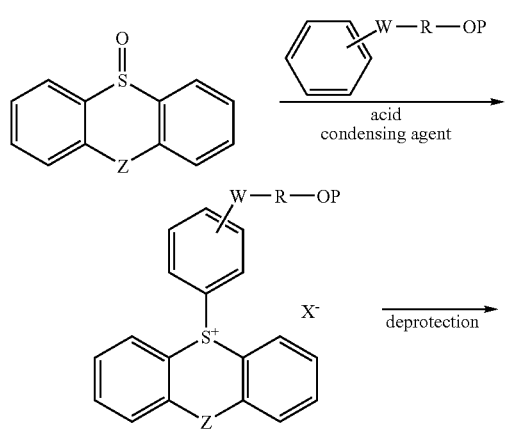

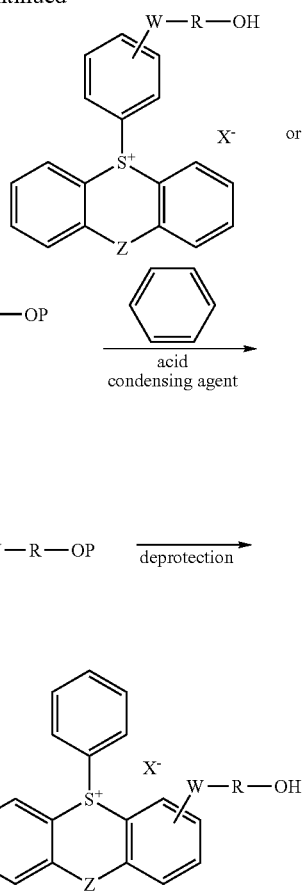

(In the Figure above, W is a divalent linking group, R is an alkylene group, and P is a protective group.)

Examples of the acid used for the reaction of sulfonium formation include a methanesulfonic acid, an ethanesulfonic acid, a propanesulfonic acid, a butanesulfonic acid, a pentanesulfonic acid, a trifluoromethanesulfonic acid, a benzenesulfonic acid, a p-toluenesulfonic acid, a p-ethylbenzenesulfonic acid and a nonafluorobutanesulfonic acid, and the conjugate base of the acid used becomes the anion of sulfonium. The condensing agent for use in the reaction of sulfonium formation includes an acid anhydride and the like, and examples thereof include an anhydride of strong acid, such as trifluoroacetic anhydride, polyphosphoric anhydride, methanesulfonic anhydride, trifluoromethanesulfonic anhydride, p-toluenesulfonic anhydride, nonafluorobutanesulfonic anhydride, tetrafluorosuccinic anhydride, hexafluoroglutaric anhydride, chlorodifluoroacetic anhydride, pentafluoropropionic anhydride, and heptafluorobutanoic anhydride.

The protective group P of the hydroxyl group includes an ether, an ester and the like, and examples thereof include a methyl ether, an aryl ether, a benzyl ether, an acetic acid ester, a benzoic acid ester, and a carbonic acid ester.

The counter anion $X^-$ can be converted into a desired anion by adding a conjugate acid of the objective anion through an ion exchange resin.

Specific examples of the compound represented by formula (I) are set forth below, but the present invention is not limited thereto.

(z70)
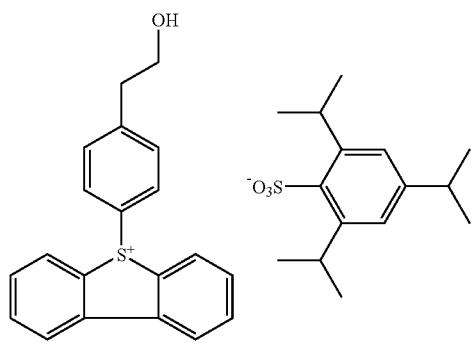
(z74)
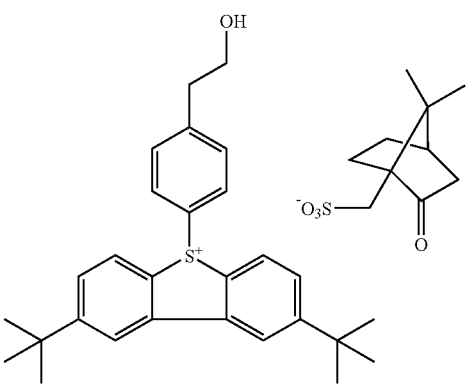
(z71)
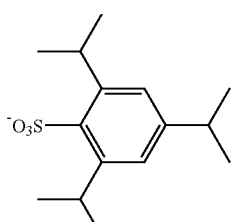
(z75)
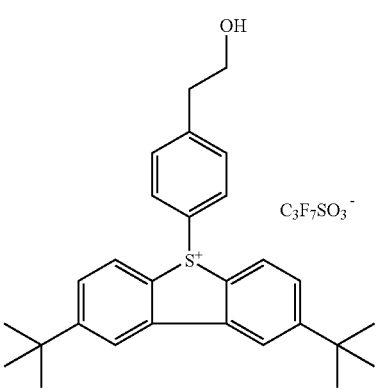
(z72)
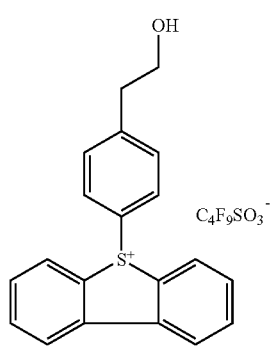
(z76)
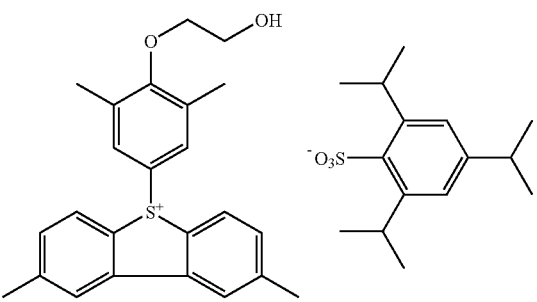
(z73)
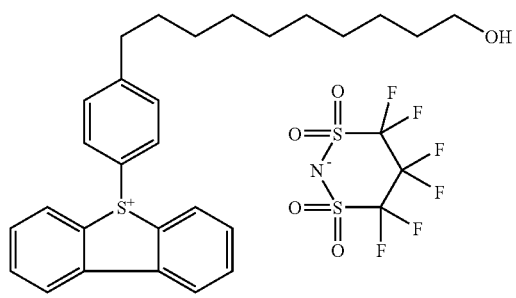
(z77)
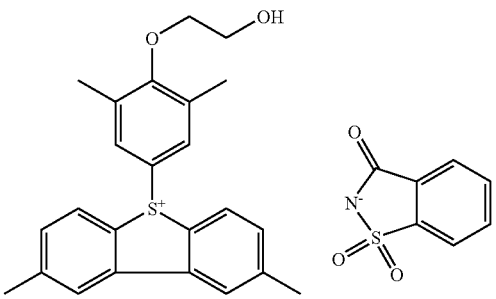
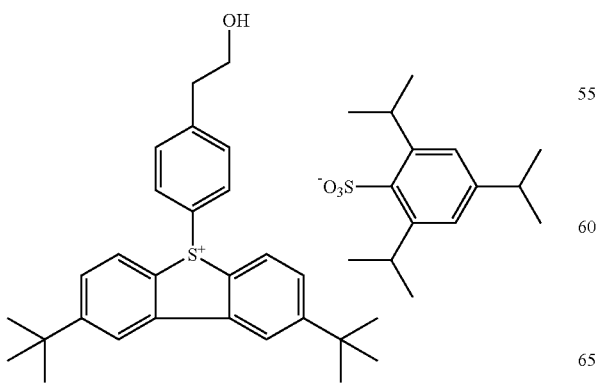

53
-continued
(z78)
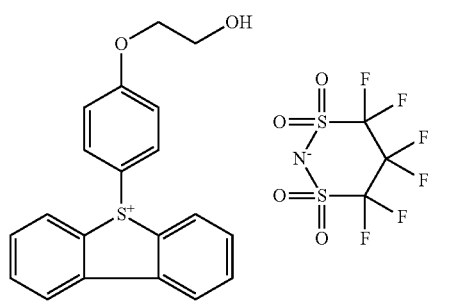
(z79)
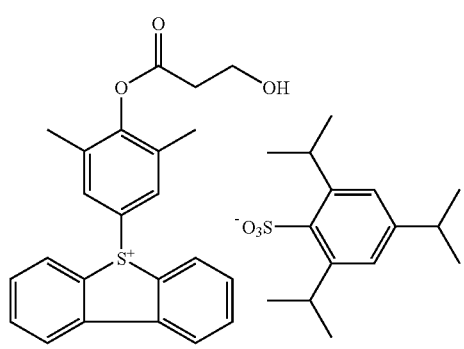
(z80)
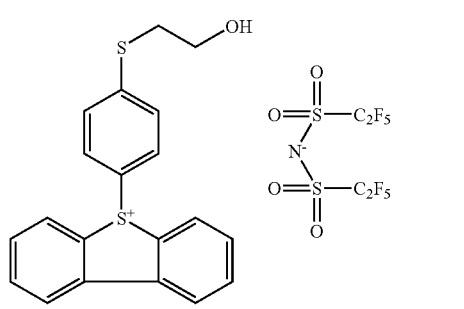
(z81)
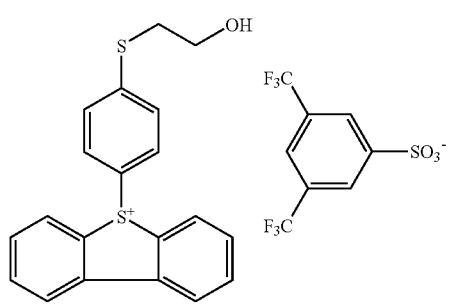
(z82)
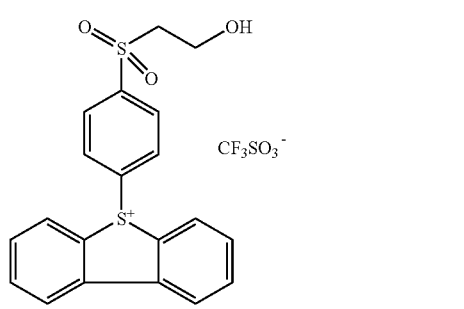
54
-continued
(z83)
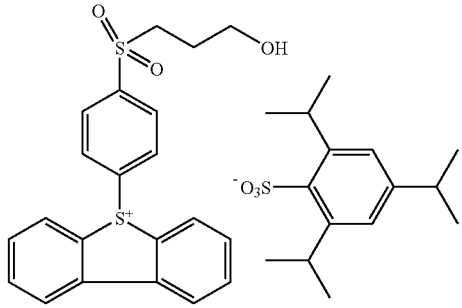
(z84)
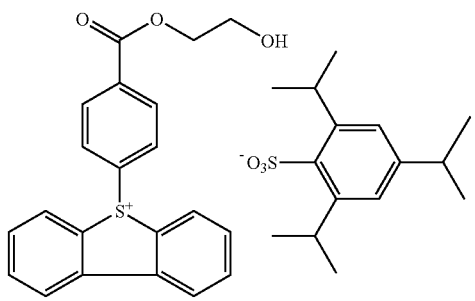
(z85)
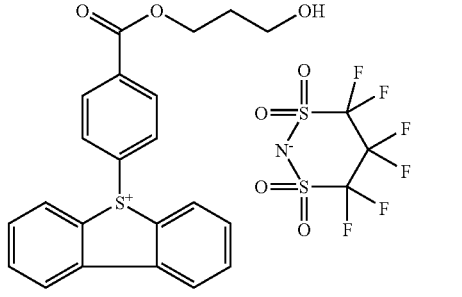
(z86)
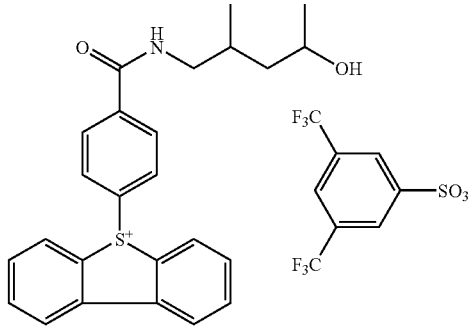
(z87)
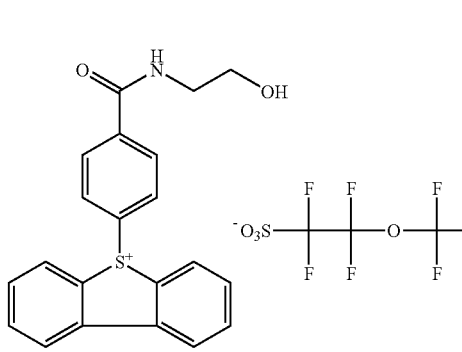

(z88)
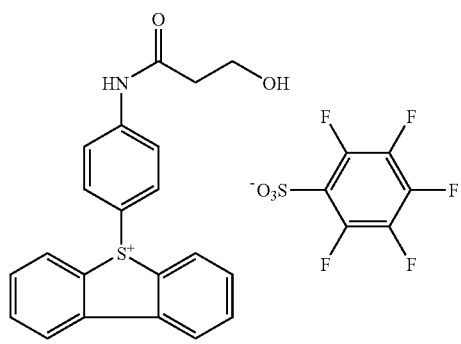
(z89)
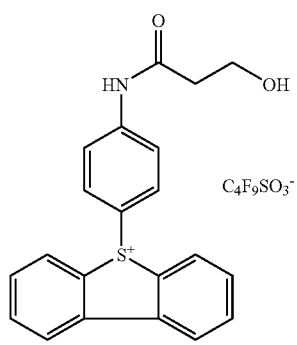
(z90)
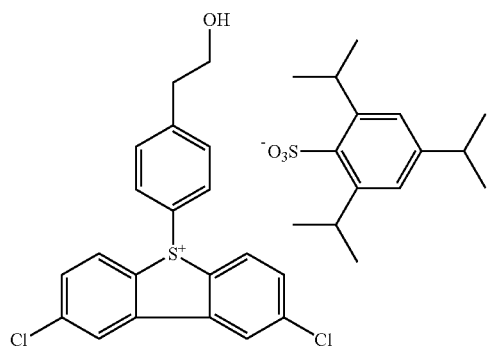 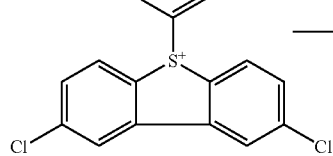
(z91)
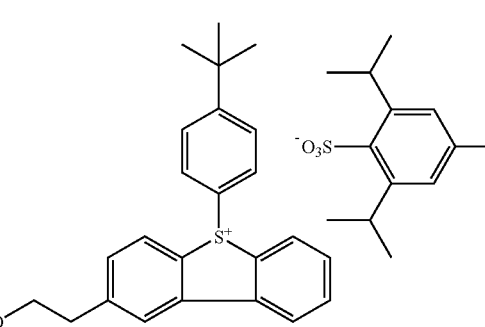
(z92)
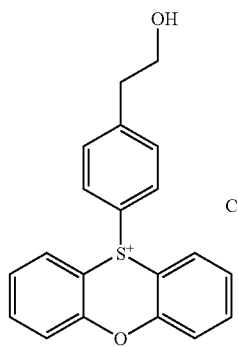
(z93)
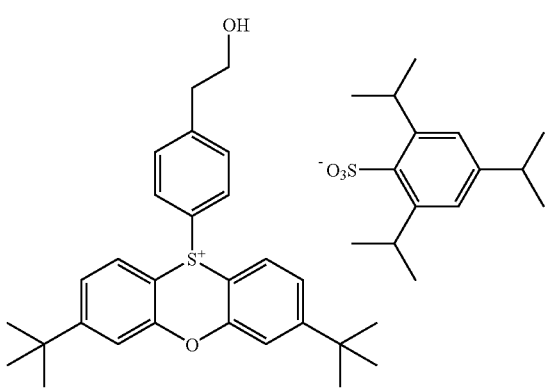
(z94)
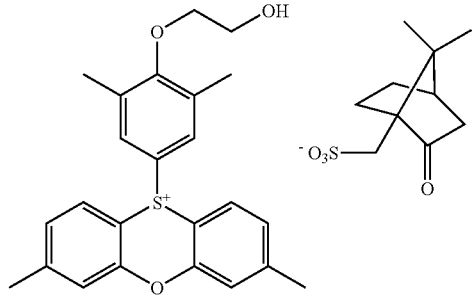
(z95)
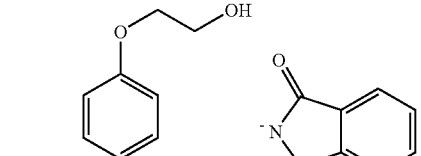
(z96)
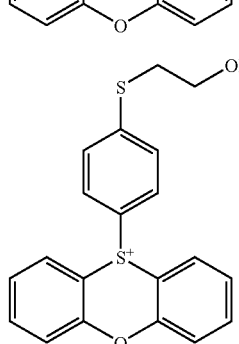

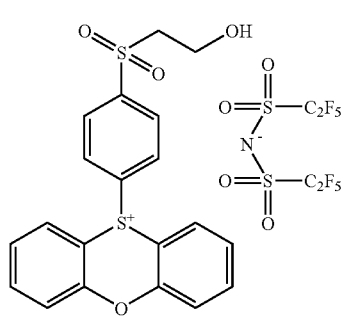 (z97)

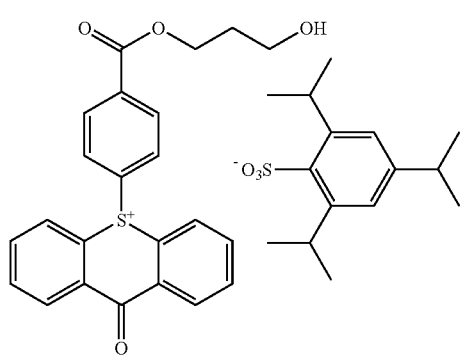 (z98)

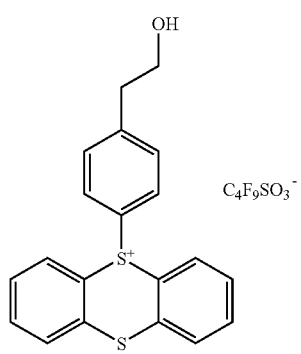 (z99)

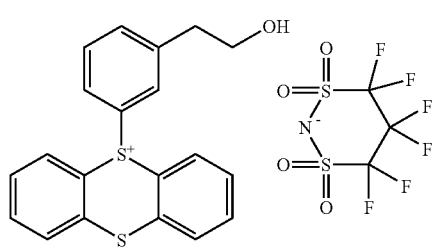 (z100)

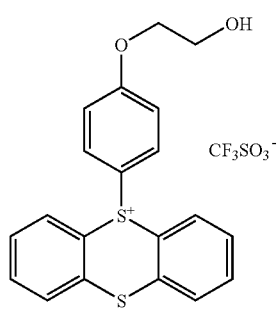 (z101)

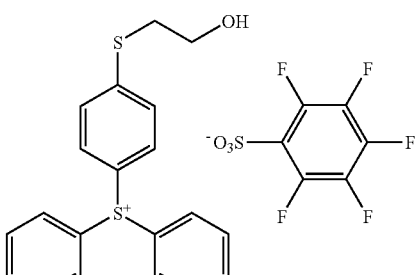 (z102)

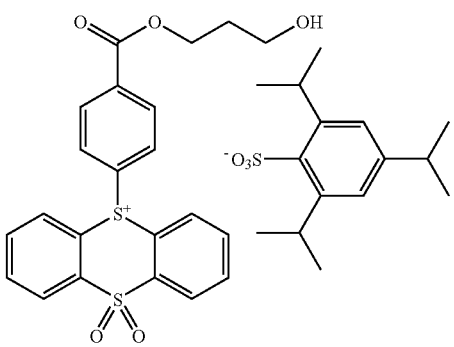 (z103)

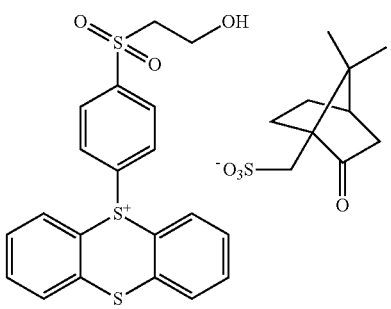 (z104)

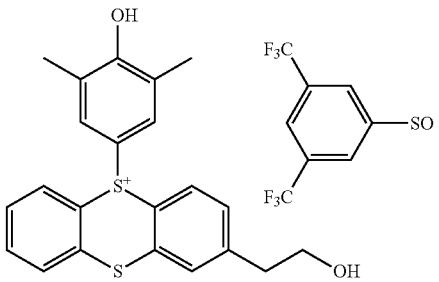 (z105)

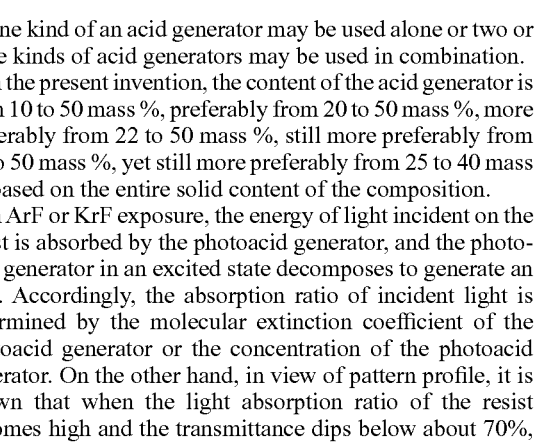

One kind of an acid generator may be used alone or two or more kinds of acid generators may be used in combination.

In the present invention, the content of the acid generator is from 10 to 50 mass %, preferably from 20 to 50 mass %, more preferably from 22 to 50 mass %, still more preferably from 25 to 50 mass %, yet still more preferably from 25 to 40 mass %, based on the entire solid content of the composition.

In ArF or KrF exposure, the energy of light incident on the resist is absorbed by the photoacid generator, and the photoacid generator in an excited state decomposes to generate an acid. Accordingly, the absorption ratio of incident light is determined by the molecular extinction coefficient of the photoacid generator or the concentration of the photoacid generator. On the other hand, in view of pattern profile, it is known that when the light absorption ratio of the resist becomes high and the transmittance dips below about 70%, the pattern profile worsens. Therefore, there is naturally a limit on the concentration of the photoacid generator.

Whereas, in the EUV or EB exposure, the energy per one incident photon or one incident electron is very high as compared with the conventional ArF or KrF exposure, and the absorption ratio for the energy scarcely depends on the chemical structure of the resist and therefore, the concentration of the photoacid generator is considered to be not limited by the transmittance.

On the other hand, rise in the concentration of the photoacid generator rises is found to bring about mutual aggregation of the photoacid generator and cause reduction in the acid generation efficiency or deterioration of stability. In the present invention, it has been found that even a photoacid generator in a high concentration, which has been substantially unusable in the conventional resist for ArF or KrF because of a problem in the transmittance or aggregation of photoacid generator, can be effectively used by optimizing the solid content concentration. This is an utterly unexpected effect but it is considered that by keeping proper the concentration of the photoacid generator in the resist solution state (this relates to the "entire solid content concentration" described later), the stable dispersed state can be maintained even after a resist film is formed.

[3] (C) Basic Compound

The resist composition of the present invention preferably contains a basic compound for reducing the change in performance with aging from exposure until heating. The basic compound fulfills the role of quenching the deprotection reaction by the acid generated upon exposure, and the diffusivity or basicity of the basic compound affects the substantial acid diffusivity.

As for the preferred structure, the basic compound includes those having a structure represented by the following formulae (A) to (E).

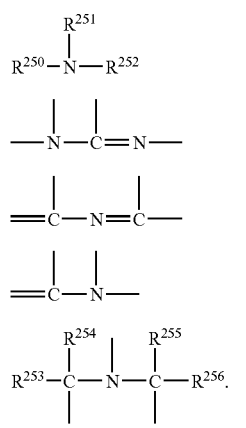

In the formulae above, $R^{250}$, $R^{251}$ and $R^{252}$ each independently represents a hydrogen atom, an alkyl group (preferably having a carbon number of 1 to 20), a cycloalkyl group (preferably having a carbon number of 3 to 20), or an aryl group (preferably having a carbon number of 6 to 20), and $R^{250}$ and $R^{251}$ may combine with each other to form a ring.

These groups each may have a substituent. The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20. The alkyl chain thereof may contain an oxygen atom, a sulfur atom or a nitrogen atom.

In the formulae, $R^{253}$, $R^{254}$, $R^{255}$ and $R^{256}$ each independently represents an alkyl group (preferably having a carbon number of 1 to 6) or a cycloalkyl group (preferably having a carbon number of 3 to 6).

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is changed to a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Other examples include at least one nitrogen-containing compound selected from a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group.

The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group.

The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. The organic sulfonate includes an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, buthanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring each may have a substituent, and the substituent is preferably a linear or branched alkyl group having a carbon number of 1 to 6, or a cycloalkyl group having a carbon number of 3 to 6. Specific examples of the linear or branched alkyl group and the cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The phenoxy group-containing amine compound and the phenoxy group-containing ammonium salt compound are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

The sulfonic acid ester group in the sulfonic acid ester group-containing amine compound and the sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

The phenoxy group-containing amine compound can be obtained by reacting a primary or secondary amine having a phenoxy group with a haloalkyl ether under heating, adding an aqueous solution of strong base such as sodium hydroxide, potassium hydroxide and tetraalkylammonium, and performing extraction with an organic solvent such as ethyl acetate and chloroform, or by reacting a primary or secondary amine with a haloalkyl ether having a phenoxy group at the terminal under heating, adding an aqueous solution of strong base such as sodium hydroxide, potassium hydroxide and tetraalkylammonium, and performing extraction with an organic solvent such as ethyl acetate and chloroform.

One of these basic compounds may be used alone, or two or more thereof may be used in combination.

The molecular weight of the basic compound is preferably from 250 to 1,000, more preferably from 250 to 800, still more preferably from 400 to 800.

The content of the basic compound is preferably from 1.0 to 8.0 mass %, more preferably from 1.5 to 5.0 mass %, still more preferably from 2.0 to 4.0 mass %, based on the entire solid content of the composition.

[4] Solid Content Concentration and (D) Solvent

The resist composition of the present invention is prepared by dissolving the above-described components in a solvent.

The resist composition is stored, for example, in a refrigerated state or at room temperature and preferably causes no change in the performance during the storage period, but there is a problem that the sensitivity fluctuates after storage.

In the construction of the present invention, it is found that the fluctuation of sensitivity can be remarkably suppressed by adjusting the entire solid content concentration in the resist composition to be from 1.0 to 4.5 mass %.

The entire solid content concentration in the resist composition is preferably from 2.0 to 4.0 mass %, more preferably from 2.0 to 3.0 mass %.

The entire solid content corresponds to the content after removing the solvent from the composition and corresponds to the mass of the coating film after drying.

The solvent for the preparation of the resist composition is preferably an organic solvent such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran, more preferably cyclohexanone, γ-butyrolactone, propylene glycol monomethyl ether, propylene glycol monomethyl ether acetate or ethyl lactate, still more preferably propylene glycol monomethyl ether.

The solvent may be one kind of a solvent alone or may be a mixed solvent obtained by mixing two or more kinds of solvents.

Out of the entire solvent amount, propylene glycol monomethyl ether is preferably contained in a ratio of 50 mass % or more, most preferably from 50 to 80 mass %. The solvent used in combination with propylene glycol monomethyl ether is preferably propylene glycol monomethyl ether acetate, cyclohexanone or ethyl acetate, and most preferably propylene glycol monomethyl ether acetate.

The resist composition of the present invention may contain the following components, in addition to the components described above.

[5] (E) Fluorine-Containing and/or Silicon-Containing Surfactants

The resist composition of the present invention preferably further contains any one of fluorine-containing and/or silicon-containing surfactants (a fluorine-containing surfactant, a silicon-containing surfactant, and a surfactant containing both a fluorine atom and a silicon atom), or two or more thereof.

By incorporating the fluorine-containing and/or silicon-containing surfactant into the resist composition of the present invention, a resist pattern with good sensitivity, resolution and adherence as well as less development defect can be obtained.

Examples of the fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K. K.); Florad FC430 and 431 (produced by Sumitomo 3M Inc.); Megaface F171, F173, F176, F189 and R$^{08}$ (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), a copolymer of a $C_6F_{13}$ group-containing acrylate (or methacrylate) with a (poly(oxyethylene)) acrylate (or methacrylate) and a (poly(oxypropylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with a (poly(oxyethylene)) acrylate (or methacrylate) and a (poly(oxypropylene)) acrylate (or methacrylate).

The amount of the fluorine-containing and/or silicon-containing surfactants used is preferably from 0.0001 to 2 mass %, more preferably from 0.001 to 1 mass %, based on the entire solid amount of the resist composition.

[6] (F) Dissolution Inhibiting Compound Having a Molecular Weight of 3,000 or Less, which Decomposes Under the Action of an Acid to Increase the Solubility in an Alkali Developer Hereinafter, this compound is sometimes referred to as a "component (F)" or a "dissolution inhibiting compound".

The (F) dissolution inhibiting compound having a molecular weight of 3,000 or less, which decomposes under the action of an acid to increase the solubility in an alkali developer is preferably an alicyclic or aliphatic compound containing an acid-decomposable group, such as acid-decomposable group-containing cholic acid derivatives described in Proceeding of SPIE, 2724, 355 (1996), so as not to reduce the transparency to light at 220 nm or less.

In the case of irradiating an electron beam, the resist composition of the present invention preferably contains a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the entire solid content of the resist composition.

Specific examples of the dissolution inhibiting compound are set forth below, but the present invention is not limited thereto.

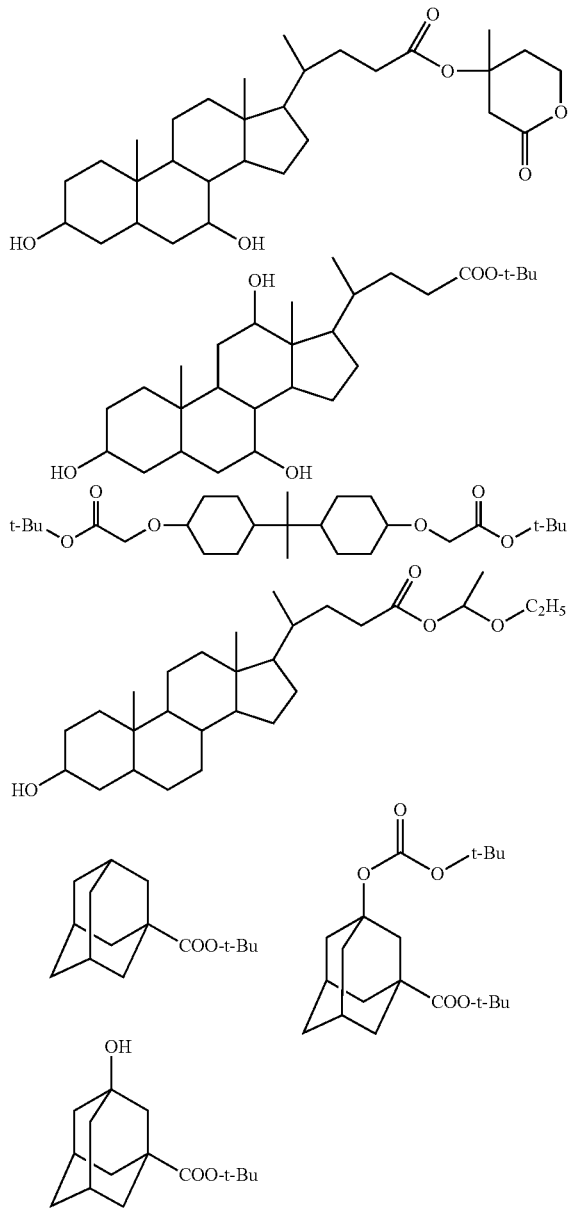

[7] Other Additives

The resist composition of the present invention may further contain a dye, a plasticizer, a surfactant other than the component (E), a photosensitizer, a compound capable of accelerating solubility in a developer, or the like, if desired.

The compound capable of accelerating the dissolution in a developer, which can be used in the present invention, is a low molecular compound containing two or more phenolic OH groups or one or more carboxy groups and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the resin as the component (A).

The amount added is preferably 50 mass % or less from the standpoint of suppressing the development scum or preventing the deformation of pattern at the development.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

In the present invention, a surfactant other than the (E) fluorine-containing and/or silicon-containing surfactants may also be added. Specific examples thereof include a nonionic surfactant such as polyoxyethylene alkyl ethers, polyoxyethylene alkylallyl ethers, polyoxyethylene·polyoxypropylene block copolymers, sorbitan aliphatic esters, and polyoxyethylene sorbitan aliphatic esters.

One of these surfactants may be added alone, or several members thereof may be added in combination.

[8] Pattern Forming Method

The resist composition of the present invention is coated on a support such as substrate to form a resist film. The thickness of the resist film is preferably from 0.02 to 0.1 μm.

The method for coating the composition on a substrate is preferably spin coating, and the rotation number at the spin coating is preferably from 1,000 to 3,000 rpm.

For example, the resist composition is coated on a substrate (e.g., silicon/silicon dioxide-coated substrate) as used in the production of a precision integrated circuit device, by an appropriate coating method such as spinner or coater, and dried to form a resist film. Incidentally, a known antireflection film may also be previously provided.

The resist film is irradiated with an electron beam, X-ray or EUV, then preferably baked (heated), and developed, whereby a good pattern can be obtained.

In the development step, an alkali developer is used as follows. The alkali developer which can be used for the resist composition is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto.

Synthesis Example 1

Synthesis of Resin (RB-19)

p-Acetoxystyrene and (4'-hydroxyphenyl)methacrylate were charged at a ratio of 60/40 (by mol) and dissolved in tetrahydrofuran to prepare 100 mL of a solution having a solid content concentration of 20 mass %. Subsequently, 3 mol % of methyl mercaptopropionate and 4 mol % of a polymerization initiator, V-65, produced by Wako Pure Chemical Industries, Ltd. were added to the solution prepared above, and the resulting solution was added dropwise to 10 mL of tetrahydrofuran heated to 60° C., over 4 hours in a nitrogen atmosphere. After the completion of dropwise addition, the reaction solution was heated for 4 hours, and 1 mol % of V-65 was again added, followed by stirring for 4 hours. After the completion of reaction, the reaction solution was cooled to room temperature and crystallized from 3 L of hexane, and the precipitated white powder was collected by filtration.

The compositional ratio of the polymer determined from $C^{13}$-NMR was 58/42. Also, the weight average molecular weight determined by GPC was 2,200 in terms of standard polystyrene, and the dispersity (Mw/Mn) was 1.30.

The resin obtained was vacuum-dried and then dissolved in 100 ml of dehydrated THF (tetrahydrofuran), and 10 ml of cyclohexyl vinyl ether was added thereto. While stirring the resulting solution, 100 mg of p-toluenesulfonic acid was added, and the reaction was allowed to proceed for 3 hours. The reaction solution was neutralized by adding 1 ml of triethylamine, and then, liquid separation and washing were repeated three times by adding 200 ml of ethyl acetate and further adding 500 ml of distilled water. The ethyl acetate layer was reprecipitated from hexane to obtain the objective Resin RB-19 (compositional molar ratio: 43/15/32/10) having a weight average molecular weight or 2,500 and a dispersity of 1.30. The glass transition temperature of the resin was measured by DSC and found to be 110° C.

Other resins were synthesized in the same manner.

Examples 1-1 to 1-44 and Comparative Examples 1-46 to 1-49

Preparation of Resist

The components shown in Table 1 below were dissolved in a mixed solvent shown in Table 1, and the obtained solution was filtered through a polytetrafluoroethylene filter having a pore size of 0.1 μm to prepare a positive resist solution having an entire solid content concentration (mass %) shown in Table 1. This resist solution was evaluated as follows.

As for each component shown in Table 1, the solid content concentration (mass %) is on the basis of entire solid content.

The amount of the surfactant added is 0.1 mass % based on the entire solid content of the resist composition.

The solid content concentration of the resin is an amount obtained by removing the photoacid generator, basic compound and surfactant from the amount of all solid contents in the resist composition.

<Evaluation of Resist>

The positive resist solution prepared was uniformly coated on a hexamethyldisilazane-treated silicon substrate by using a spin coater and dried at 120° C. for 60 seconds on a hot plate to form a 80 nm-thick resist film.

The resist film was irradiated using an electron beam projection lithography apparatus (accelerating voltage: 100 keV) manufactured by Nikon Corp. and immediately after the irradiation, heated at 110° C. for 90 seconds on a hot plate. Furthermore, the resist film was developed with an aqueous tetramethylammonium hydroxide solution having a concentration of 2.38 mass % at 23° C. for 60 seconds, rinsed with pure water for 30 seconds and then dried to form a line-and-space pattern. The line width was measured by a scanning electron microscope (S-9260, manufactured by Hitachi, Ltd.)

[Sensitivity]

The resist film was irradiated using an electron beam projection lithography apparatus (accelerating voltage: 100 keV) manufactured by Nikon Corp. for surface exposure by changing the exposure amount in steps of 1 μC/cm² in the range from 0 to 40 μC/cm² and further baked at 110° C. for 90 seconds. Thereafter, the resist film was developed with an aqueous 2.38 mass % tetramethylammonium hydroxide (TMAH) solution, and the exposure amount required for the film thickness to become 0 was determined by fitting.

Also, the sensitivity was measured in the same manner after the resist composition prepared was refrigerated at 4° C. for 3 months.

[Exposure Latitude (EL)]

In the exposure of a 1/1 line-and-space pattern, EL was expressed by the rate of change of exposure amount required for the line width to change by 10% based on a line width of 150 nm.

[Acid-Decomposable Resin]

The structure, molecular weight and dispersity of each of the acid-decomposable resins used in Examples are shown below.

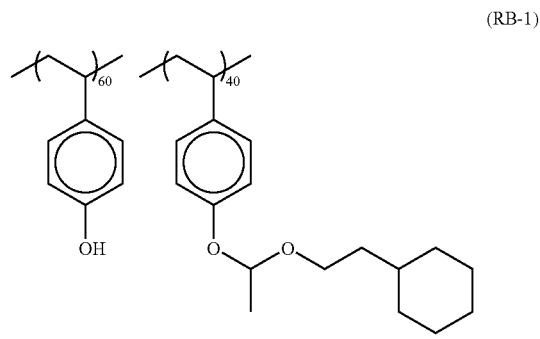

(RB-1)

Mw 10000
Mw/Mn 1.4

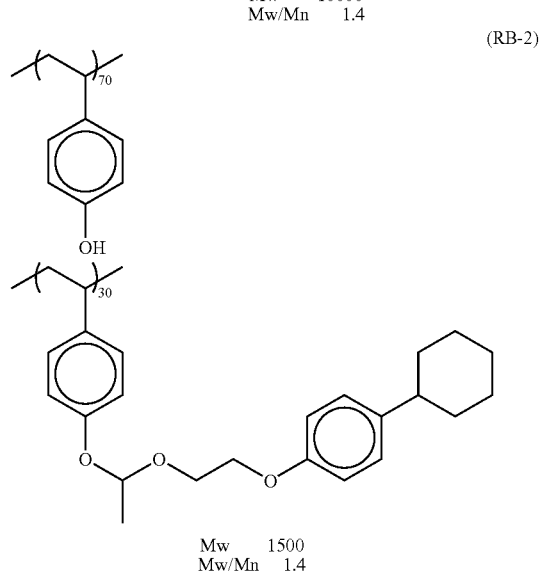

(RB-2)

Mw 1500
Mw/Mn 1.4

(RB-3)
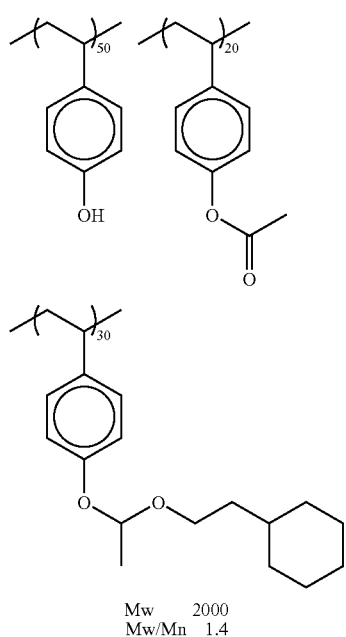
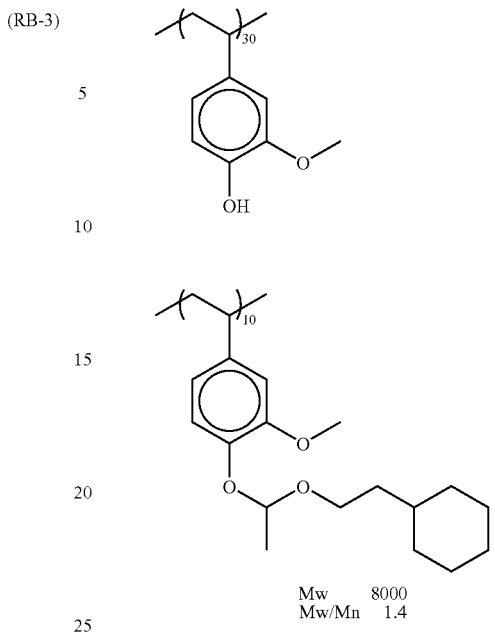
(RB-4)
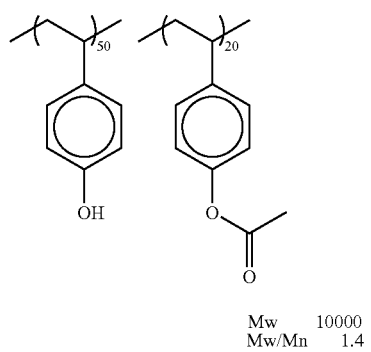
(RB-6)
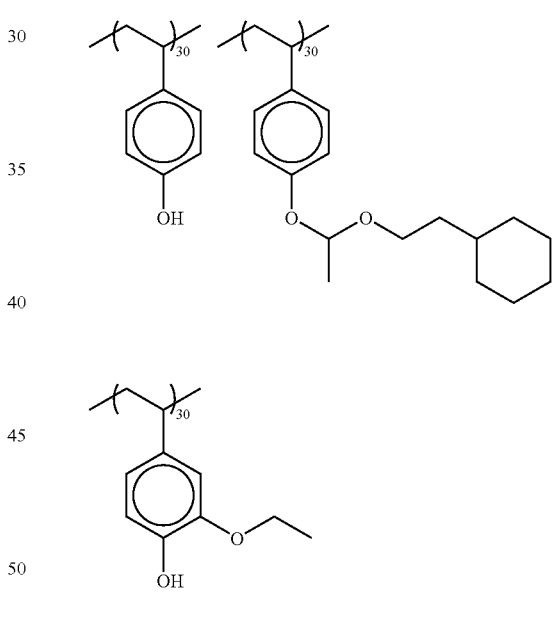
(RB-5)
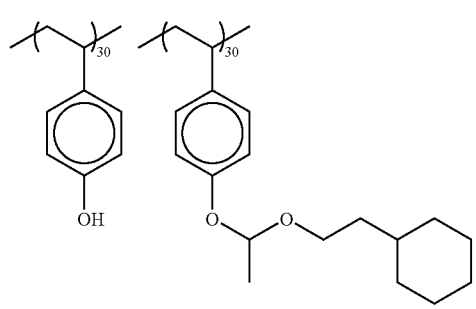
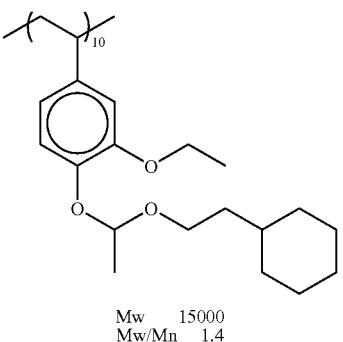

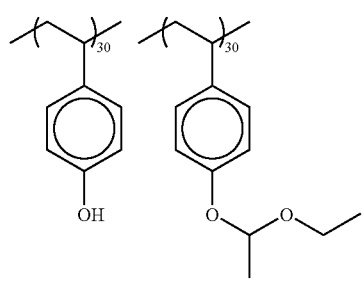
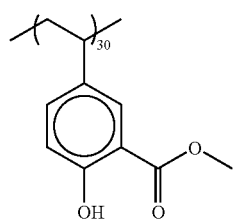
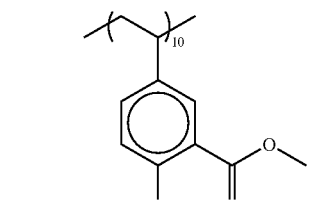
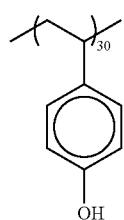
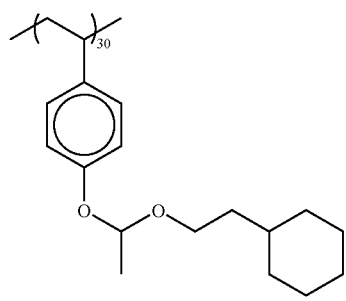
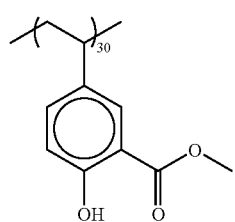
(RB-7)
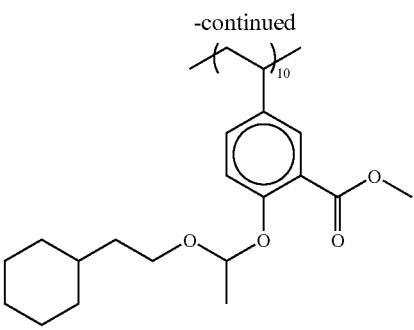
(RB-8)
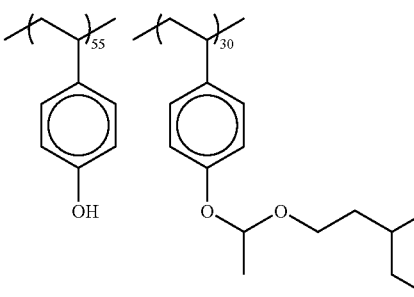
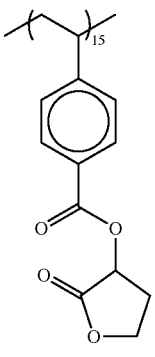
(RB-9)
(RB-10)
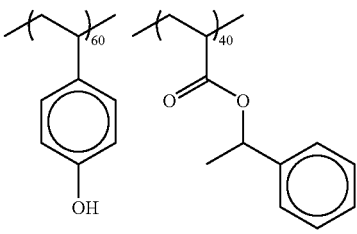
(RB-11)
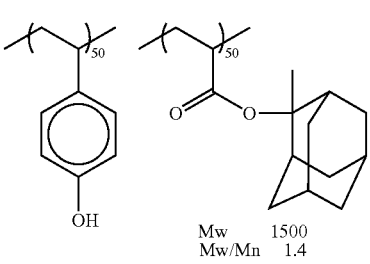

(RB-12)
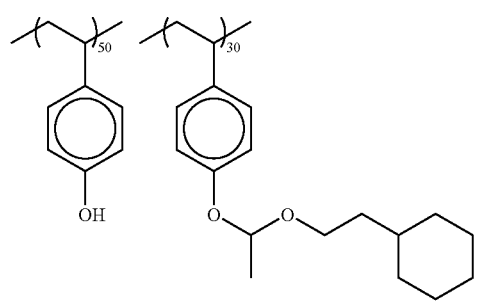
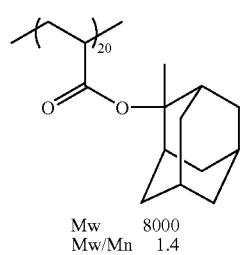
Mw 8000
Mw/Mn 1.4
(RB-13)
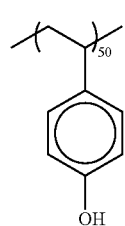
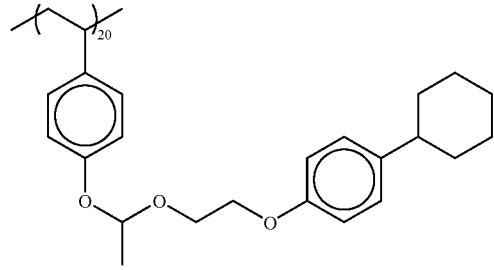
Mw 8000
Mw/Mn 1.4
(RB-14)
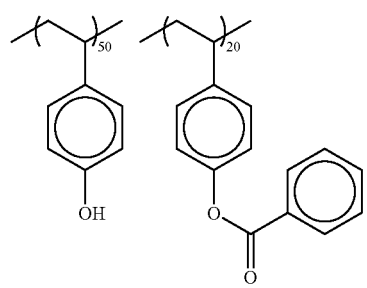
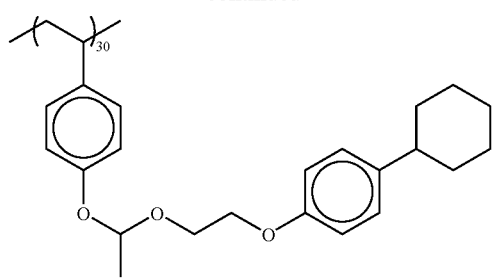
Mw 1500
Mw/Mn 1.4
(RB-15)
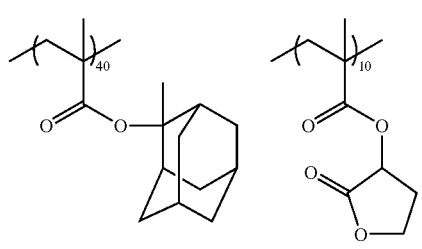
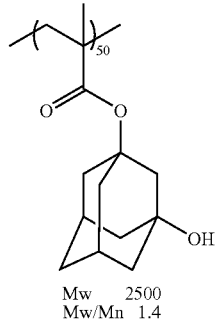
Mw 2500
Mw/Mn 1.4
(RB-16)
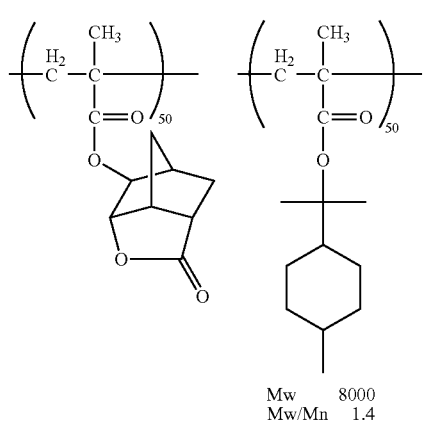
Mw 8000
Mw/Mn 1.4
(RB-17)
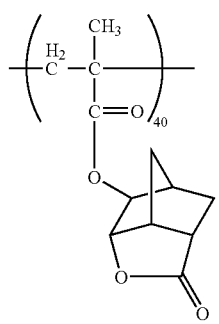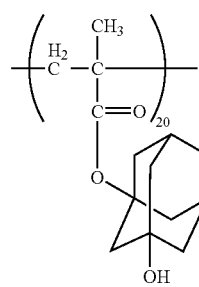

75
-continued
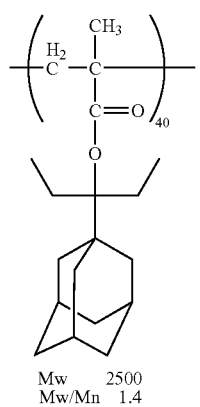
Mw 2500
Mw/Mn 1.4
(RB-18)
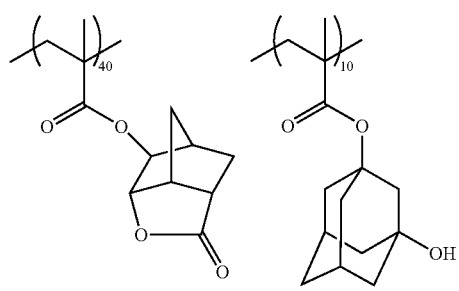
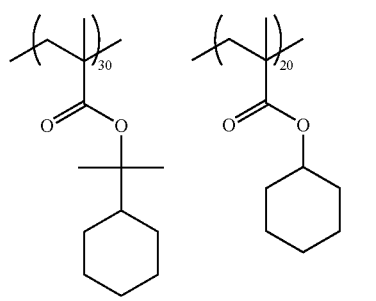
Mw 2500
Mw/Mn 1.4
(RB-19)
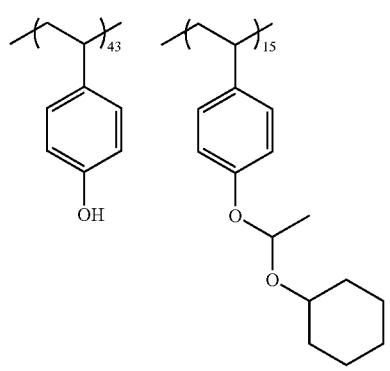
76
-continued
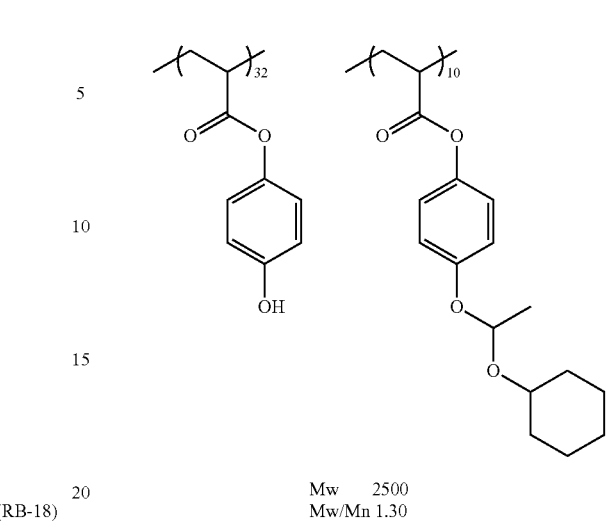
Mw 2500
Mw/Mn 1.30
[Acid Generator]
The acid generators shown in Table 1 correspond to those illustrated above.
[Basic Compound]
A-1
Mw: 195
A-2
Mw: 261
A-3
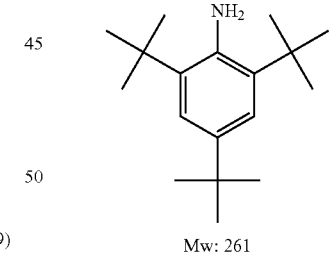
Mw: 296

-continued

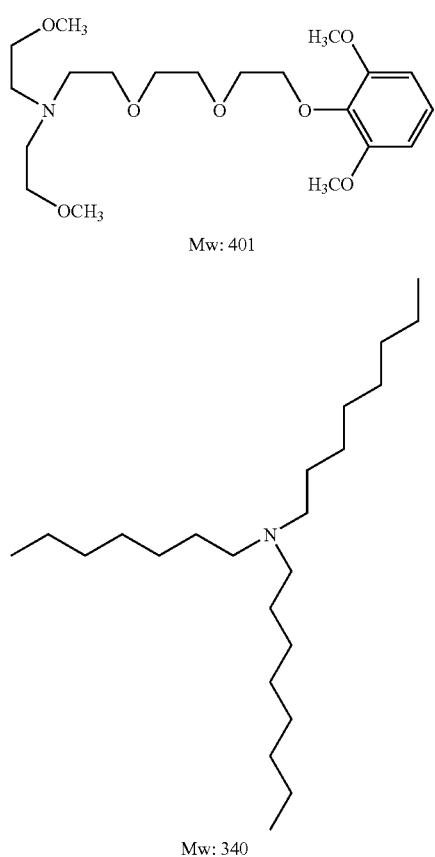

A-4
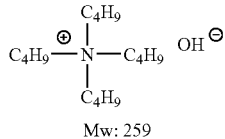
Mw: 259

A-5

A-6

A-7
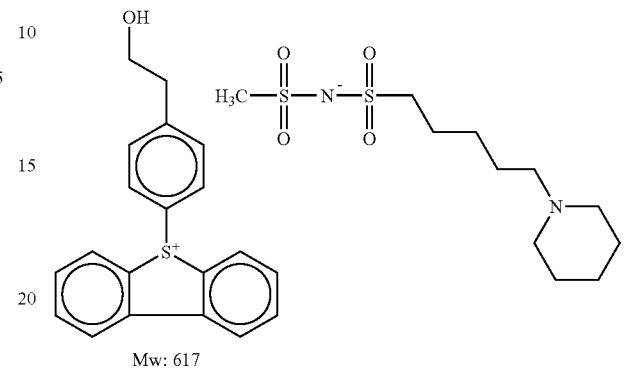

[Surfactant]
W-1: Megaface F-176 (produced by Dainippon Ink & Chemicals, Inc.) (fluorine-containing surfactant)
W-2: Megaface $R^{08}$ (produced by Dainippon Ink & Chemicals, Inc.) (fluorine- and silicon-containing surfactant)
W-3: Polysiloxane Polymer KP-341 (produced by Shin-Etsu Chemical Co., Ltd.) (silicon-containing surfactant)
[Solvent]
A1: propylene glycol monomethyl ether acetate
B1: propylene glycol monomethyl ether

TABLE 1

| | Acid Generator (solid content concentration (mass %)) | Resin | Basic Compound (solid content concentration (mass %)) | Surfactant | Entire Solid Content Concentration (mass %) | Solvent (mass ratio) | Sensitivity ($\mu C/cm^2$) (immediately after preparation) | EL (%) | EL/Sensitivity | $\Delta$Sensitivity ($\mu C/cm^2$) (after storage at 4° C. for 3 months) |
|---|---|---|---|---|---|---|---|---|---|---|
| Example | | | | | | | | | | |
| 1-1 | z4 (11) | RB-2 | A-3 (2.6) | W-1 | 3.0 | A1/B1 (40/60) | 27.0 | 28.2 | 1.04 | −0.1 |
| 1-2 | z4 (22) | RB-2 | A-3 (2.6) | W-1 | 3.0 | A1/B1 (40/60) | 19.6 | 23.1 | 1.18 | 0.1 |
| 1-3 | z4 (26) | RB-2 | A-3 (2.6) | W-1 | 3.0 | A1/B1 (40/60) | 18.0 | 23.6 | 1.31 | −0.1 |
| 1-4 | z4 (33) | RB-2 | A-3 (2.6) | W-1 | 3.0 | A1/B1 (40/60) | 15.9 | 24.2 | 1.55 | −0.2 |
| 1-5 | z4 (39) | RB-2 | A-3 (2.6) | W-1 | 3.0 | A1/B1 (40/60) | 14.9 | 22.4 | 1.50 | 0.2 |
| 1-6 | z4 (43) | RB-2 | A-3 (2.6) | W-1 | 3.0 | A1/B1 (40/60) | 14.5 | 19.3 | 1.33 | −0.1 |
| 1-7 | z4 (48) | RB-2 | A-3 (2.6) | W-1 | 3.0 | A1/B1 (40/60) | 14.2 | 17.6 | 1.24 | −0.1 |
| 1-8 | z4 (33) | RB-2 | A-3 (2.6) | W-1 | 2.2 | A1/B1 (40/60) | 15.8 | 24.1 | 1.52 | −0.1 |
| 1-9 | z4 (33) | RB-2 | A-3 (2.6) | W-1 | 1.5 | A1/B1 (40/60) | 15.2 | 22.5 | 1.48 | −0.3 |
| 1-10 | z4 (33) | RB-2 | A-3 (2.6) | W-1 | 4.2 | A1/B1 (40/60) | 14.8 | 20.1 | 1.36 | −0.3 |
| 1-11 | z4 (45) | RB-2 | A-3 (2.6) | W-1 | 4.2 | A1/B1 (40/60) | 14.3 | 17.9 | 1.25 | −0.5 |
| 1-12 | z4 (45) | RB-2 | A-3 (2.6) | W-1 | 1.5 | A1/B1 (40/60) | 14.0 | 18.2 | 1.30 | −0.4 |
| 1-13 | z4 (15) | RB-2 | A-3 (2.6) | W-1 | 1.5 | A1/B1 (40/60) | 24.2 | 28.1 | 1.16 | −0.4 |
| 1-14 | z4 (15) | RB-2 | A-3 (2.6) | W-1 | 4.2 | A1/B1 (40/60) | 24.9 | 27.4 | 1.10 | −0.5 |

TABLE 1-continued

| | Acid Generator (solid content concentration (mass %)) | Resin | Basic Compound (solid content concentration (mass %)) | Surfactant | Entire Solid Content Concentration (mass %) | Solvent (mass ratio) | Sensitivity ($\mu C/cm^2$) (immediately after preparation) | EL (%) | EL/Sensitivity | ΔSensitivity ($\mu C/cm^2$) (after storage at 4° C. for 3 months) |
|---|---|---|---|---|---|---|---|---|---|---|
| 1-15 | z66 (28) | RB-3 | A-3 (2.2) | W-1 | 2.5 | A1/B1 (40/60) | 13.5 | 19.2 | 1.42 | −0.1 |
| 1-16 | z66 (28) | RB-3 | A-1 (1.4) | W-1 | 2.5 | A1/B1 (40/60) | 13.8 | 16.4 | 1.19 | −0.1 |
| 1-17 | z66 (28) | RB-3 | A-2 (1.9) | W-1 | 2.5 | A1/B1 (40/60) | 14.3 | 19.7 | 1.38 | 0 |
| 1-18 | z66 (28) | RB-3 | A-4 (3.0) | W-1 | 2.5 | A1/B1 (40/60) | 14.1 | 22.6 | 1.60 | −0.1 |
| 1-19 | z66 (28) | RB-3 | A-5 (2.5) | W-1 | 2.5 | A1/B1 (40/60) | 15.0 | 23.0 | 1.53 | −0.1 |
| 1-20 | z66 (28) | RB-3 | A-6 (1.9) | W-1 | 2.5 | A1/B1 (40/60) | 13.1 | 19.5 | 1.49 | −0.2 |
| 1-21 | z66 (28) | RB-3 | A-7 (4.6) | W-1 | 2.5 | A1/B1 (40/60) | 11.5 | 21.4 | 1.86 | −0.1 |
| 1-22 | z66 (28) | RB-3 | A-7 (6.9) | W-1 | 2.5 | A1/B1 (40/60) | 14.8 | 29.2 | 1.97 | −0.1 |
| 1-23 | z66 (28) | RB-3 | A-7 (1.3) | W-1 | 2.5 | A1/B1 (40/60) | 7.3 | 10.4 | 1.42 | 0 |
| 1-24 | z66 (28) | RB-3 | A-7 (0.8) | W-1 | 2.5 | A1/B1 (40/60) | 7.0 | 8.3 | 1.19 | 0 |
| 1-25 | z66 (28) | RB-3 | A-7 (8.5) | W-1 | 2.5 | A1/B1 (40/60) | 18.1 | 24.4 | 1.35 | −0.2 |
| 1-26 | z69 (30) | RB-19 | A-6 (1.9) | W-1 | 2.5 | A1/B1 (40/60) | 15.3 | 23.9 | 1.56 | −0.2 |
| 1-27 | z69 (30) | RB-19 | A-6 (3.8) | W-1 | 2.5 | A1/B1 (40/60) | 30.1 | 50.0 | 1.65 | −0.3 |
| 1-28 | z69 (30) | RB-19 | A-6 (3.8) | W-1 | 2.5 | A1/B1 (40/60) | 30.1 | 50.0 | 1.65 | −0.3 |
| 1-29 | z69 (37) | RB-18 | A-4 (4.2) | W-1 | 2.5 | A1/B1 (40/60) | 23.0 | 31.5 | 1.37 | 0 |
| 1-30 | z67 (37) | RB-11 | A-4 (4.2) | W-1 | 2.5 | A1/B1 (40/60) | 22.1 | 33.1 | 1.48 | 0 |
| 1-31 | z67 (37) | RB-14 | A-4 (4.2) | W-1 | 2.5 | A1/B1 (40/60) | 17.4 | 29.4 | 1.69 | −0.1 |
| 1-32 | z67 (37) | RB-7 | A-4 (4.2) | W-1 | 2.5 | A1/B1 (40/60) | 16.7 | 28.7 | 1.72 | −0.1 |
| 1-33 | z58 (23) | RB-7 | A-2 (2.3) | W-1 | 2.5 | A1/B1 (40/60) | 17.3 | 22.1 | 1.28 | −0.3 |
| 1-34 | z12 (23) | RB-7 | A-2 (2.3) | W-1 | 2.5 | A1/B1 (40/60) | 16.5 | 21.6 | 1.31 | −0.1 |
| 1-35 | z2 (23) | RB-7 | A-2 (2.3) | W-1 | 2.5 | A1/B1 (40/60) | 15.1 | 18.7 | 1.24 | −0.1 |
| 1-36 | z65 (23) | RB-7 | A-2 (2.3) | W-1 | 2.5 | A1/B1 (40/60) | 14.7 | 19.1 | 1.30 | −0.1 |
| 1-37 | z38 (31) | RB-11 | A-3 (2.4) | W-2 | 2.5 | A1/B1 (40/60) | 11.3 | 15.0 | 1.33 | −0.2 |
| 1-38 | z38 (31) | RB-11 | A-3 (2.4) | W-3 | 2.5 | A1/B1 (40/60) | 12.1 | 1.6 | 1.35 | −0.1 |
| 1-39 | z4 (43) | RB-2 | A-3 (2.6) | W-1 | 3.0 | A1/B1 (80/20) | 17.9 | 20.6 | 1.15 | −0.5 |
| 1-40 | z4 (43) | RB-2 | A-3 (2.6) | W-1 | 3.0 | A1/B1 (20/80) | 14.4 | 20.2 | 1.40 | 0 |
| 1-41 | z66 (28) | RB-3 | A-4 (4.5) | W-1 | 2.5 | A1/B1 (40/60) | 21.3 | 33.5 | 1.57 | −0.1 |
| 1-42 | z66 (28) | RB-3 | A-4 (6.0) | W-1 | 2.5 | A1/B1 (40/60) | 29.2 | 45.0 | 1.54 | −0.1 |
| 1-43 | z66 (28) | RB-3 | A-4 (7.5) | W-1 | 2.5 | A1/B1 (40/60) | 39.1 | 57.8 | 1.48 | −0.3 |
| 1-44 | z66 (28) | RB-3 | A-1 (4.0) | W-1 | 2.5 | A1/B1 (40/60) | 40.1 | 44.9 | 1.12 | −0.1 |
| Comparative Example | | | | | | | | | | |
| 1-46 | z4 (8) | RB-2 | A-3 (2.6) | W-1 | 3.0 | A1/B1 (40/60) | 33.1 | 32.4 | 0.98 | −0.3 |
| 1-47 | z4 (52) | RB-2 | A-3 (2.6) | W-1 | 3.0 | A1/B1 (40/60) | 23.0 | 14.3 | 0.62 | 2.1 |
| 1-48 | z4 (33) | RB-2 | A-3 (2.6) | W-1 | 0.9 | A1/B1 (40/60) | 18.9 | 18.1 | 0.96 | −1.5 |
| 1-49 | z4 (33) | RB-2 | A-3 (2.6) | W-1 | 5.5 | A1/B1 (40/60) | 16.4 | 15.3 | 0.93 | 2.1 |

It is seen from the results in Tables 1 and 2 that according to the present invention, a resist with good balance between sensitivity and EL and excellent in the aging stability of sensitivity can be obtained (this is apparent from the item of "EL/sensitivity" in Tables).

The same effects are obtained in the EUV and X-ray lithographies.

According to the present invention, a positive resist composition assured of high sensitivity, insusceptibility to fluctuation of the exposure amount, that is, high EL, and good aging stability, and a pattern forming method using the composition can be provided.

The entire disclosure of each and every foreign patent application from which the benefit of foreign priority has been claimed in the present application is incorporated herein by reference, as if fully set forth.

What is claimed is:

1. A positive resist composition for use with electron beam, X-ray or EUV, comprising:
   a resin capable of decomposing under an action of an acid to increase a dissolution rate in an aqueous alkali solution;
   a compound capable of generating an acid upon irradiation with actinic rays or radiation;
   a basic compound; and
   an organic solvent,
   wherein the entire solids content concentration in the resist composition is from 1.0 to 4.5 mass %, the ratio of (B) the compound capable of generating an acid upon irradiation with actinic rays or radiation is from 10 to 50 mass % based on the entire solids content, and (A) the resin capable of decomposing under an action of an acid to increase the dissolution rate in an aqueous alkali solution has a repeating unit represented by formula (II) and a repeating unit represented by formula (III):

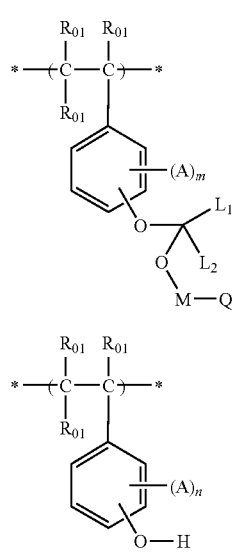

wherein each $R_{01}$ independently represents a hydrogen atom, an alkyl group, a cycloalkyl group, a halogen atom, a cyano group or an alkoxycarbonyl group;
$L_1$ and $L_2$, which may be the same or different, each represents a hydrogen atom, an alkyl group, a cycloalkyl group, an aryl group or an aralkyl group;
M represents a single bond or a divalent linking group;
Q represents an alkyl group, a cycloalkyl group, an aryloxy group or an alicyclic or aromatic cyclic group which may contain a hetero atom;
at least two members out of Q, M and $L_1$ may combine to form a 5- or 6-membered ring;
A represents a halogen atom, a cyano group, an acyl group, an alkyl group, an alkoxy group, an acyloxy group or an alkoxycarbonyl group, and when a plurality of A's are present, the plurality of A's may be the same or different; and
m and n each independently represents an integer of 0 to 4.

2. The positive resist composition according to claim 1, wherein m and n are not 0 at the same time.

3. The positive resist composition according to claim 1, wherein (A) the resin further has a repeating unit represented by formula (IV):

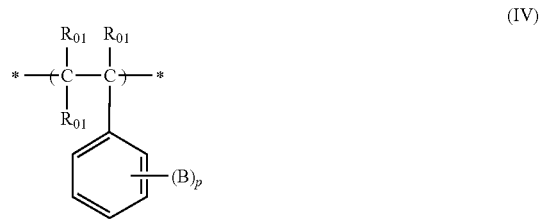

wherein each $R_{01}$ independently represents a hydrogen atom, an alkyl group, a cycloalkyl group, a halogen atom, a cyano group or an alkoxycarbonyl group;
B represents a halogen atom, a cyano group, an acyl group, an alkyl group, an alkoxy group, an acyloxy group or an alkoxycarbonyl group, and when a plurality of B's are present, the plurality of B's may be the same or different; and
p represents an integer of 0 to 5.

4. The positive resist composition according to claim 1, wherein the molecular weight of the basic compound is from 250 to 1,000, and the ratio of the basic compound is from 1.0 to 8.0 mass % based on the entire solids content of the resist composition.

5. The positive resist composition according to claim 1, wherein the compound capable of generating an acid upon irradiation with actinic rays or radiation is a compound represented by formula (I):

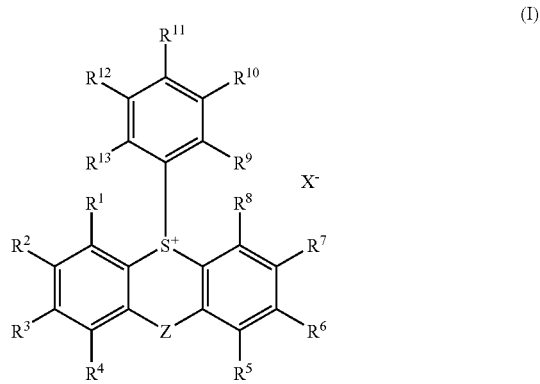

wherein $R^1$ to $R^{13}$ each independently represents a hydrogen atom or a substituent;
Z represents a single bond or a divalent linking group; and
$X^-$ represents a counter anion.

6. The positive resist composition according to claim 5, wherein at least one of $R^1$ to $R^{13}$ is a substituent containing an alcoholic hydroxyl group.

7. A pattern forming method, comprising:

forming a resist film by using the positive resist composition according to claim 1; and subjecting the resist film to exposure with electron beam, X-ray or EUV and development.

8. A positive resist composition for use with electron beam, X-ray or EUV, comprising:

(A) a resin capable of decomposing under an action of an acid to increase a dissolution rate in an aqueous alkali solution;

(B) a compound capable of generating an acid upon irradiation with actinic rays or radiation;

(C) a basic compound; and (D) an organic solvent, wherein the entire solids content concentration in the resist composition is from 1.0 to 4.5 mass %, the ratio of (B) the compound capable of generating an acid upon irradiation with actinic rays or radiation is from 10 to 50 mass % based on the entire solids content, and 50 mass % or more of (D) the organic solvent is a propylene glycol monomethyl ether.

9. A pattern forming method, comprising:

forming a resist film by using the positive resist composition according to claim 8; and subjecting the resist film to exposure with electron beam, X-ray or EUV and development.

* * * * *